United States Patent
Sato et al.

(10) Patent No.: US 10,529,767 B2
(45) Date of Patent: Jan. 7, 2020

(54) SOLID STATE IMAGE SENSOR, FABRICATION METHOD, AND ELECTRONIC APPARATUS

(71) Applicant: SONY SEMICONDUCTOR SOLUTIONS CORPORATION, Kanagawa (JP)

(72) Inventors: Naoyuki Sato, Kanagawa (JP); Ryosuke Matsumoto, Tokyo (JP); Junpei Yamamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/742,987

(22) PCT Filed: Jul. 1, 2016

(86) PCT No.: PCT/JP2016/069592
§ 371 (c)(1),
(2) Date: Jan. 9, 2018

(87) PCT Pub. No.: WO2017/010311
PCT Pub. Date: Jan. 19, 2017

(65) Prior Publication Data
US 2019/0088696 A1    Mar. 21, 2019

(30) Foreign Application Priority Data
Jul. 16, 2015   (JP) .................. 2015-141883

(51) Int. Cl.
*H01L 27/146* (2006.01)
*H01L 25/065* (2006.01)
(Continued)

(52) U.S. Cl.
CPC ...... *H01L 27/1464* (2013.01); *H01L 25/0657* (2013.01); *H01L 27/1463* (2013.01);
(Continued)

(58) Field of Classification Search
CPC .......... H01L 27/1464; H01L 27/14665; H01L 27/14689; H01L 27/307; H01L 27/14647
See application file for complete search history.

(56) References Cited

U.S. PATENT DOCUMENTS 9,947,703 B2 *  4/2018  Azami ............... H01L 27/1461
2009/0149023 A1  6/2009  Koyanagi
(Continued)

FOREIGN PATENT DOCUMENTS

| JP | 2003-086827 | 3/2003 |
| JP | 2012-129551 | 7/2012 |
| JP | 2015-038931 | 2/2015 |

OTHER PUBLICATIONS

International Search Report prepared by the Japan Patent Office dated Aug. 26, 2016, for International Application No. PCT/JP2016/069592.

*Primary Examiner* — Hoang-Quan T Ho
*Assistant Examiner* — Khatib A Rahman
(74) *Attorney, Agent, or Firm* — Sheridan Ross P.C.

(57) ABSTRACT

The present disclosure relates to a solid state image sensor, a fabrication method, and an electronic apparatus, which enable to efficiently provide trench structures, which surrounds respective pixel sections of the solid state image sensor, and through-electrodes side by side. A solid state image sensor according to a first aspect of the present disclosure includes photoelectric conversion sections formed in respective pixel sections of a semiconductor substrate, trench structures defined by walls of insulating films formed in a depth direction of the semiconductor substrate and surrounding the respective pixel sections, and through-electrodes formed through the semiconductor substrate at positions overlapping the respective trench struc-
(Continued)

tures. The present disclosure can be applied, for example, to back-side illumination CMOS image sensors.

14 Claims, 32 Drawing Sheets

(51) Int. Cl.
    *H01L 27/30*         (2006.01)
    *H04N 5/374*       (2011.01)

(52) U.S. Cl.
    CPC .. *H01L 27/14612* (2013.01); *H01L 27/14638* (2013.01); *H01L 27/14647* (2013.01); *H01L 27/14665* (2013.01); *H01L 27/14689* (2013.01); *H01L 27/307* (2013.01); *H04N 5/374* (2013.01)

(56) References Cited

U.S. PATENT DOCUMENTS

| | | | |
|---|---|---|---|
| 2011/0019042 A1* | 1/2011 | Yamaguchi | H01L 27/14632 348/280 |
| 2016/0204156 A1 | 7/2016 | Togashi | |
| 2018/0286922 A1* | 10/2018 | Togashi | H01L 27/281 |
| 2018/0337216 A1* | 11/2018 | Toda | H01L 27/14 |
| 2019/0006407 A1* | 1/2019 | Uesaka | H01L 27/14 |
| 2019/0198547 A1* | 6/2019 | Yoshigiwa | H01L 27/1463 |

* cited by examiner

SOLID STATE IMAGE SENSOR, FABRICATION METHOD, AND ELECTRONIC APPARATUS

CROSS REFERENCE TO RELATED APPLICATIONS

This application is a national stage application under 35 U.S.C. 371 and claims the benefit of PCT Application No. PCT/JP2016/069592 having an international filing date of 1 Jul. 2016, which designated the United States, which PCT application claimed the benefit of Japan Patent Application No. 2015-141883 filed 16 Jul. 2015, the disclosure of each of which are incorporated herein by reference.

TECHNICAL FIELD

The present disclosure relates to a solid state image sensor, a fabrication method, and an electronic apparatus, and especially to a solid state image sensor, a fabrication method, and an electronic apparatus, which can be suitably used in a case where providing each pixel with a through-electrode.

BACKGROUND ART

Keeping in step with an increase in the number of pixels per unit area in solid state image sensors represented by CCD image sensors and CMOS image sensors, the pixel size is decreasing in recent years. As a consequence, the number of photons that enter each pixel has decreased to lower the sensitivity so that a reduction in S/N may arise.

Further, in the currently wide-used structure that each pixel is covered by a color filter of one of R (red color), G (green color), and B (blue color), a loss arises in terms of sensitivity because in a red pixel, for example, green light and blue light do not transmit through the color filter and are not used in photoelectric conversion. In addition, a color signal of only one of R, G, and B is available from each pixel so that interpolation processing is conducted among pixels. However, false colors may be produced upon such interpolation.

As a measure for resolving these problems, there is known an image sensor structure in which three layers of photoelectric conversion sections are stacked in a vertical direction for each pixel so that photoelectrically-converted signals of the three colors can be obtained at each pixel. Specifically, a structure has been proposed in which, for example, an organic photoelectric conversion film corresponding to G light is provided over a Si substrate, and PDs (photodiodes) which correspond to B and R individually are stacked in the Si substrate (see, for example, PTL 1 or 2).

In the above-mentioned structure, it is necessary to transfer charges from the organic photoelectric conversion film above the Si substrate to an FD (floating diffusion) formed on an opposite side of the Si substrate. A structure has, therefore, been proposed in which a through-electrode for each pixel is formed extending through a Si substrate and charges are transferred from the organic photoelectric conversion film to the FD via the through-electrode (see, for example, PTL3).

CITATION LIST

Patent Literature

[PTL 1]
  JP 2003-332551A
[PTL 2]
  JP 2005-340571A
[PTL 3]
  JP 2015-38931A

SUMMARY

Technical Problem

As mentioned above, it has been difficult to achieve a size reduction in the structure that at each pixel, photoelectric conversion sections are stacked and a through-electrode is provided.

Further, a method is also known in which trenches with an insulator filled therein are provided at boundaries between individual pixels to inhibit color mixing between the adjacent pixels (which may hereinafter be called "trench structure" or "RDTI structure"). If it is desired to arrange the above-described through-electrodes and trench structures side by side, a need arises to contrive their layout.

The present disclosure has been completed with the foregoing circumstances in view, and enables to efficiently arrange through-electrodes and trench structures side by side.

Solution to Problem

A solid state image sensor according to a first aspect of the present disclosure includes photoelectric conversion sections formed in respective pixel sections of a semiconductor substrate, trench structures defined by walls of insulating films formed in a depth direction of the semiconductor substrate and surrounding the respective pixel sections, and through-electrodes formed through the semiconductor substrate at positions overlapping the respective trench structures.

The through-electrodes can each connect one of the photoelectric conversion sections, which are formed on one side of the semiconductor substrate, and an FD, which is formed on an opposite side of the semiconductor substrate, with each other.

The photoelectric conversion sections can each include a photoelectric conversion film formed on the one side of the semiconductor substrate.

The through-electrodes can each be formed of a conductive film filled in a hole that is formed in the insulating film defining the corresponding trench structure.

A fabrication method of a solid state image sensor, the fabrication method being according to the first aspect of the present disclosure, includes forming trenches surrounding respective pixel sections of a semiconductor substrate and in a depth direction of the semiconductor substrate, and filling insulating films in the respective trenches, by which trench structures are formed, and forming holes in the insulating films in the respective trench structures and filling conductive films in the respective holes, by which through-electrodes are formed.

In an electronic apparatus with a solid state image sensor mounted thereon, the electronic apparatus being according to the first aspect of the present disclosure, the solid state image sensor includes photoelectric conversion sections formed in respective pixel sections of a semiconductor substrate, trench structures defined by walls of insulating films formed in a depth direction of the semiconductor substrate and surrounding the respective pixel sections, and through-electrodes formed through the semiconductor substrate at positions overlapping the respective trench structures.

A solid state image sensor according to a second aspect of the present disclosure includes photoelectric conversion sections formed in respective pixel sections of a semiconductor substrate, trench structures defined by walls of insulating films formed in a depth direction of the semiconductor substrate and surrounding the respective pixel sections, and through-electrodes formed through the semiconductor substrate at positions overlapping the respective trench structures. The trench structures are each formed from straight portions and crosspoints where the straight portions intersect one another, and the through-electrodes are each formed at a position that overlaps one of the straight portions of the corresponding trench structure.

The straight portions and the crosspoints of each trench structure and the associated through-electrode can have the following relationship in layout dimension:
through-electrode>crosspoints of trench structure>straight portions of trench structure.

The straight portions and the crosspoints of each trench structure and the associated through-electrode can have the following relationship in depth:
through-electrode>crosspoints of trench structure>straight portions of trench structure.

In a fabrication method according to the second aspect of the present disclosure, the method being for the fabrication of a solid state image sensor including photoelectric conversion sections formed in respective pixel sections of a semiconductor substrate, trench structures defined by walls of insulating films formed in a depth direction of the semiconductor substrate and surrounding the respective pixel sections, and through-electrodes formed through the semiconductor substrate at positions overlapping the respective trench structures, the trench structures being each formed from straight portions and crosspoints where the straight portions intersect one another, and the through-electrodes being each formed at a position that overlaps one of the straight portions of the corresponding trench structure, the straight portions and the crosspoints of each trench structure and the associated through-electrode have the following relationship in layout dimension:
through-electrode>crosspoints of trench structure>straight portions of trench structure, and
the straight portions and the crosspoints of each trench structure and the associated through-electrode have the following relationship in depth:
through-electrode>crosspoints of trench structure>straight portions of trench structure.

In an electronic apparatus with a solid state image sensor mounted thereon, the electronic apparatus being according to the second aspect of the present disclosure, the solid state image sensor includes photoelectric conversion sections formed in respective pixel sections of a semiconductor substrate, trench structures defined by walls of insulating films formed in a depth direction of the semiconductor substrate and surrounding the respective pixel sections, and through-electrodes formed through the semiconductor substrate at positions overlapping the respective trench structures, the trench structures are each formed from straight portions and crosspoints where the straight portions intersect one another, and the through-electrodes are each formed at a position that overlaps one of the straight portions of the corresponding trench structure.

A solid state image sensor according to a third aspect of the present disclosure includes photoelectric conversion sections formed in respective pixel sections of a semiconductor substrate, trench structures defined by walls of insulating films formed in a depth direction of the semiconductor substrate and surrounding the respective pixel sections, and through-electrodes formed through the semiconductor substrate at positions overlapping the respective trench structures, and the through-electrodes are each formed of a first conductive portion, which is formed from one side of the semiconductor substrate, and a second conductive portion, which is formed from an opposite side of the semiconductor substrate, connected with each other.

The through-electrodes can each connect one of the photoelectric conversion sections formed on the one side of the semiconductor substrate and an FD formed on an opposite side of the semiconductor substrate.

The photoelectric conversion sections can each include a photoelectric conversion film formed on the one side of the semiconductor substrate.

In a fabrication method according to a third aspect of the present embodiment, the method being for the fabrication of a solid state image sensor including photoelectric conversion sections formed in respective pixel sections of a semiconductor substrate, trench structures defined by walls of insulating films formed in a depth direction of the semiconductor substrate and surrounding the respective pixel sections, and through-electrodes formed through the semiconductor substrate at positions overlapping the respective trench structures, and the fabrication method includes forming second conductive portions from one side of the semiconductor substrate at positions where the respective through-electrodes are to be formed, forming trenches surrounding the respective pixel sections of the semiconductor substrate, from an opposite side of the semiconductor substrate and in a depth direction of the semiconductor substrate, and filling insulating films in the respective trenches, by which trench structures are formed, and forming holes in the insulating films of the respective trench structures from the opposite side of the semiconductor substrate, and filling conductive films in the respective holes to form second conductive portions so that the second conductive portions are connected with the corresponding ones of the first conductive portions, by which the through-electrodes are formed.

In an electronic apparatus with a solid state image sensor mounted thereon, the electronic apparatus being according to the third aspect of the present disclosure, the solid state image sensor includes photoelectric conversion sections formed in respective pixel sections of a semiconductor substrate, trench structures defined by walls of insulating films formed in a depth direction of the semiconductor substrate and surrounding the respective pixel sections, and through-electrodes formed through the semiconductor substrate at positions overlapping the respective trench structures, and the through-electrodes are each formed of a first conductive portion, which is formed from one side of the semiconductor substrate, and a second conductive portion, which is formed from an opposite side of the semiconductor substrate, connected with each other.

Advantageous Effects of Invention

According to the first to third aspects of the present disclosure, solid state image sensors in which through-electrodes and trench structures are efficiently provided side by side can be realized.

Further, according to the first to third aspects of the present disclosure, color mixing between adjacent pixels can be inhibited.

Furthermore, according to the first to third aspects of the present disclosure, a solid state image sensor can be reduced in size, so that photoelectric conversion sections can be enlarged in area and the light-receiving sensitivity can be improved.

DESCRIPTION OF EMBODIMENTS

With reference to the drawings, a detailed description will hereinafter be made about best modes (hereinafter called "embodiments") for practicing the present disclosure.

Solid State Image Sensor According to Embodiment of the Present Disclosure

Figure 1:
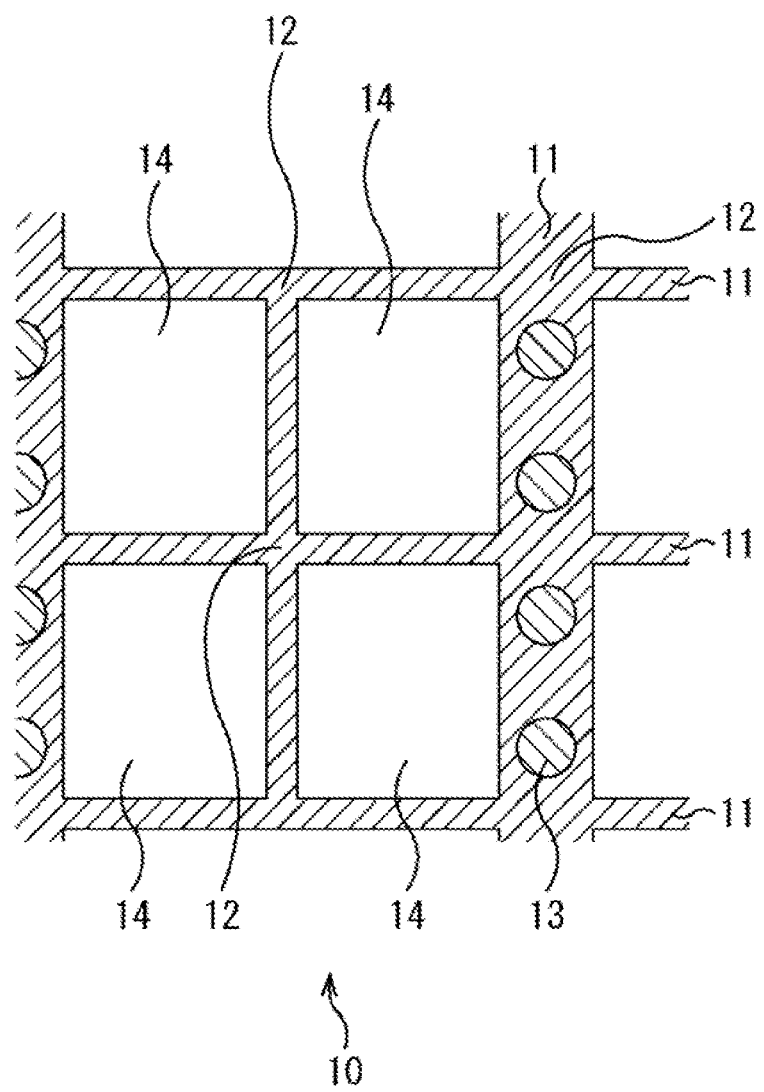
FIG. 1 is a plan view of a solid state image sensor in which through-electrodes and trench structures are provided side by side.
Figure 2:
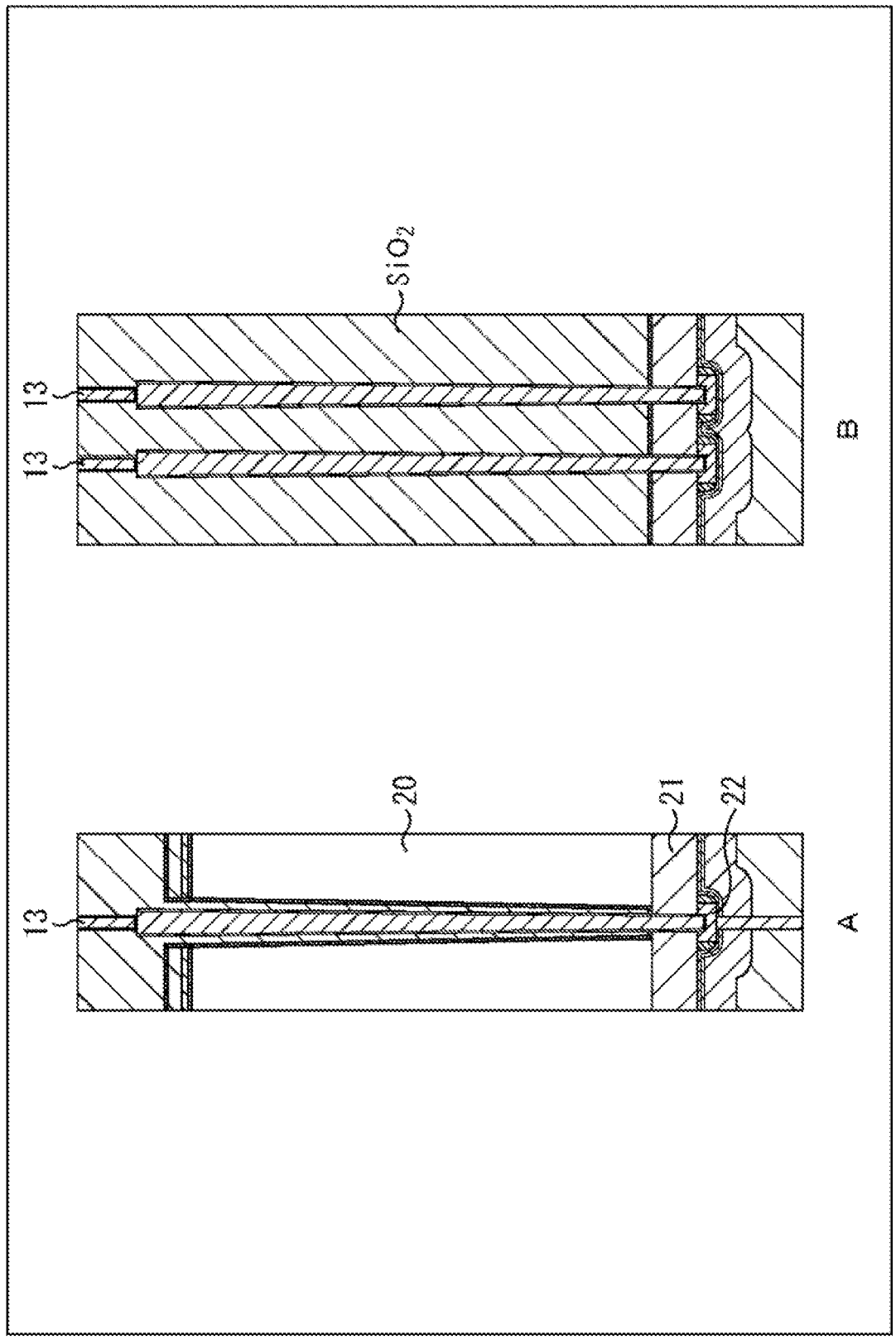
FIG. 2 depicts cross-sectional views corresponding to FIG. 1.

FIG. 1 is a plan view of a solid state image sensor according to an embodiment of the present disclosure. FIG. 2 depicts cross-sectional views corresponding to FIG. 1, and A of FIG. 2 corresponds to an X-direction of one of through-electrodes in FIG. 1 while B of FIG. 2 corresponds to a Y-direction of the through-electrodes in FIG. 1.

A solid state image sensor 10 is a so-called back-side illumination CMOS image sensor, three layers of photoelectric conversion sections (photoelectric conversion films, PDs or the like) are stacked in a vertical direction for each pixel, and trench structures 11 are formed in a grid pattern so that the trench structures 11 surround respective pixel sections 14. The trench structures 11 are provided to avoid color mixing that may arise due to charges leaked out to adjacent pixels, and walls made, for example, of an insulator (insulating films) such as $SiO_2$ or SiN are formed to the inside of a Si substrate. In each trench structure 11, crosspoints where straight portions arranged vertically or horizontally intersect each other will be specifically called "trench structure crosspoints 12."

Further, in the solid state image sensor 10, through-electrodes 13 are formed through a Si substrate 20 at positions overlapping the trench structures 11. The through-electrodes 13 are made, for example, of a conductive metal such as W, TiN, or Ti, and insulators of the same material as the trench structures are formed around the through-electrodes 13.

<First Formation Method of Trench Structures 11 and Through-Electrodes 13 in Solid State Image Sensor 10>

Next, FIG. 3 through FIG. 9 illustrate a formation method of the trench structures 11 and the through-electrodes 13 in the solid state image sensor 10. It is to be noted that each figure number labeled with suffix "A" and each figure number labeled with suffix "B" correspond to A of FIG. 2 and B of FIG. 2, respectively.

Firstly, after necessary elements such as various transistors are formed in a front side (lower side in the figures) of the Si substrate 20, the through-electrodes 13 are formed on a back side (upper side in the figures, the surface side through which light enters).

Figure 3:
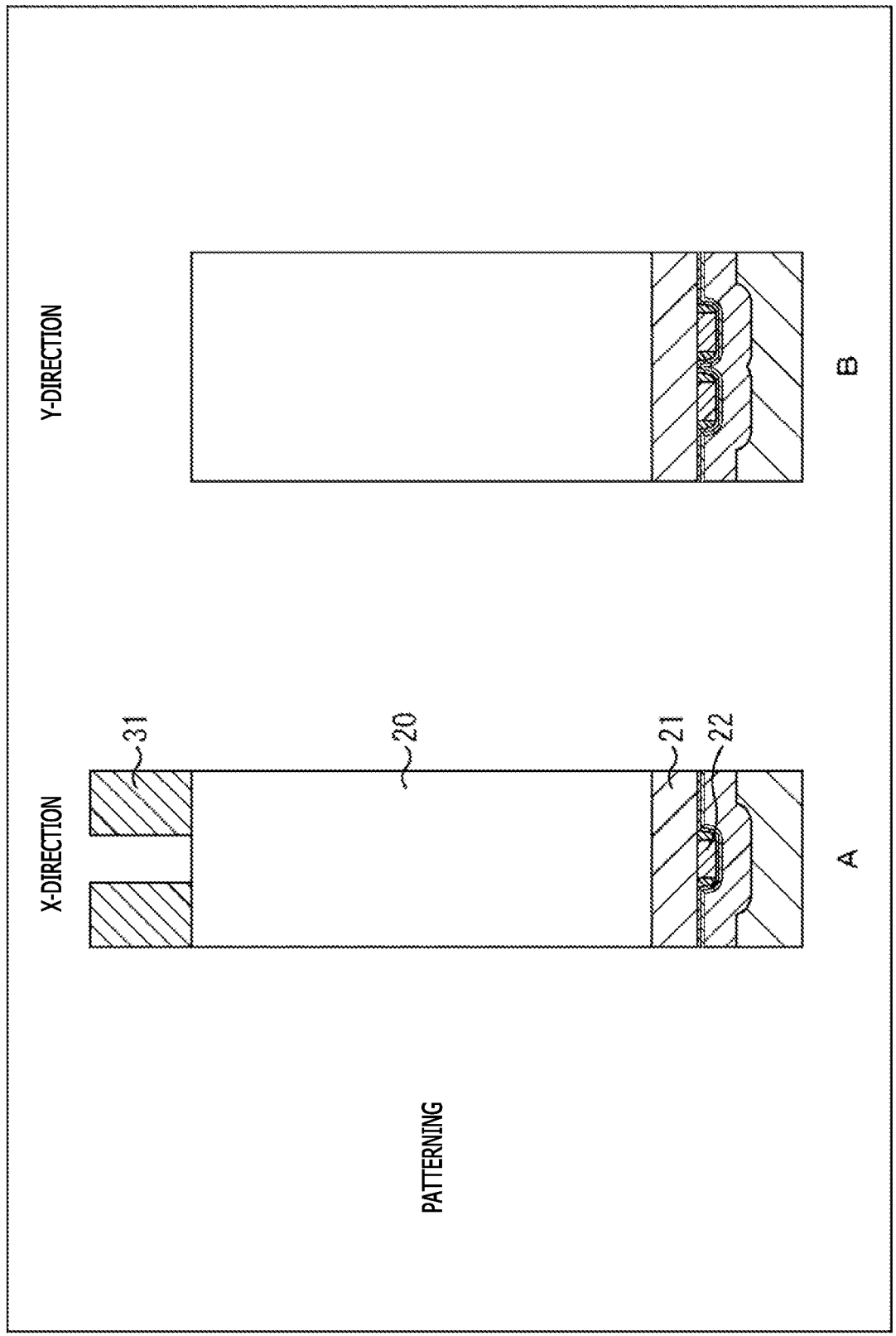
FIG. 3 depicts cross-sectional views illustrating a formation method of trench structures and through-electrodes.
Figure 4:
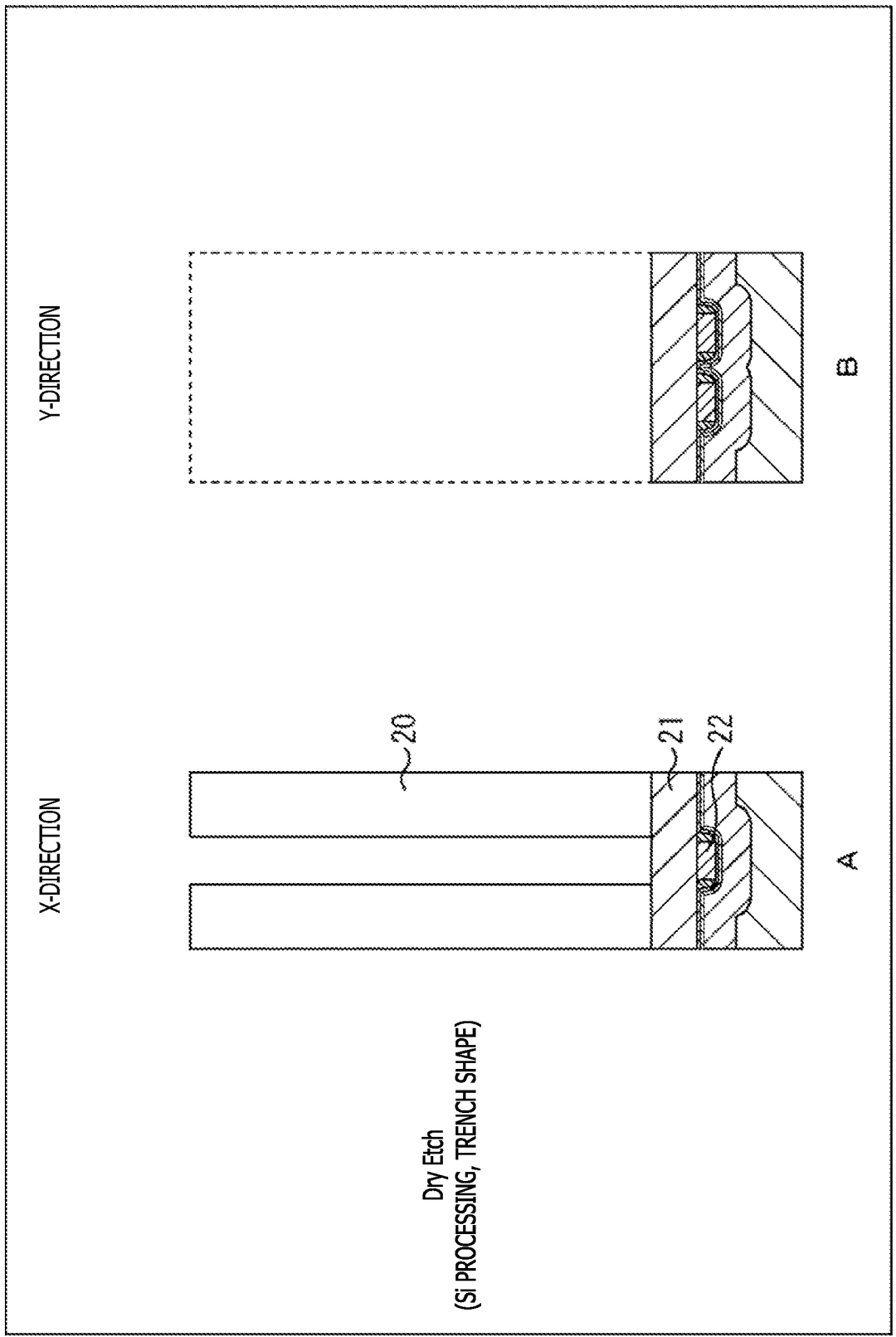
FIG. 4 depicts cross-sectional views illustrating the formation method of the trench structures and the through-electrodes.

Described specifically, as illustrated in FIG. 3, lithographic patterning is conducted to cover, with a resist 31, a front surface of the Si substrate 20 except for positions where the trench structures 11 are to be formed. Next, as illustrated in FIG. 4, the Si substrate 20 is processed at parts, where the Si substrate 20 is not covered with the resist 31, by dry etching or the like to form trenches for the trench structures 11. It is to be noted that here, the dry etching or the like is controlled to proceed down to an oxide film of an STI (Shallow Trench Isolation) 21. However, the oxide film of the STI 21 may be processed by dry etching to form trenches down to a poly electrode 22.

Figure 5:
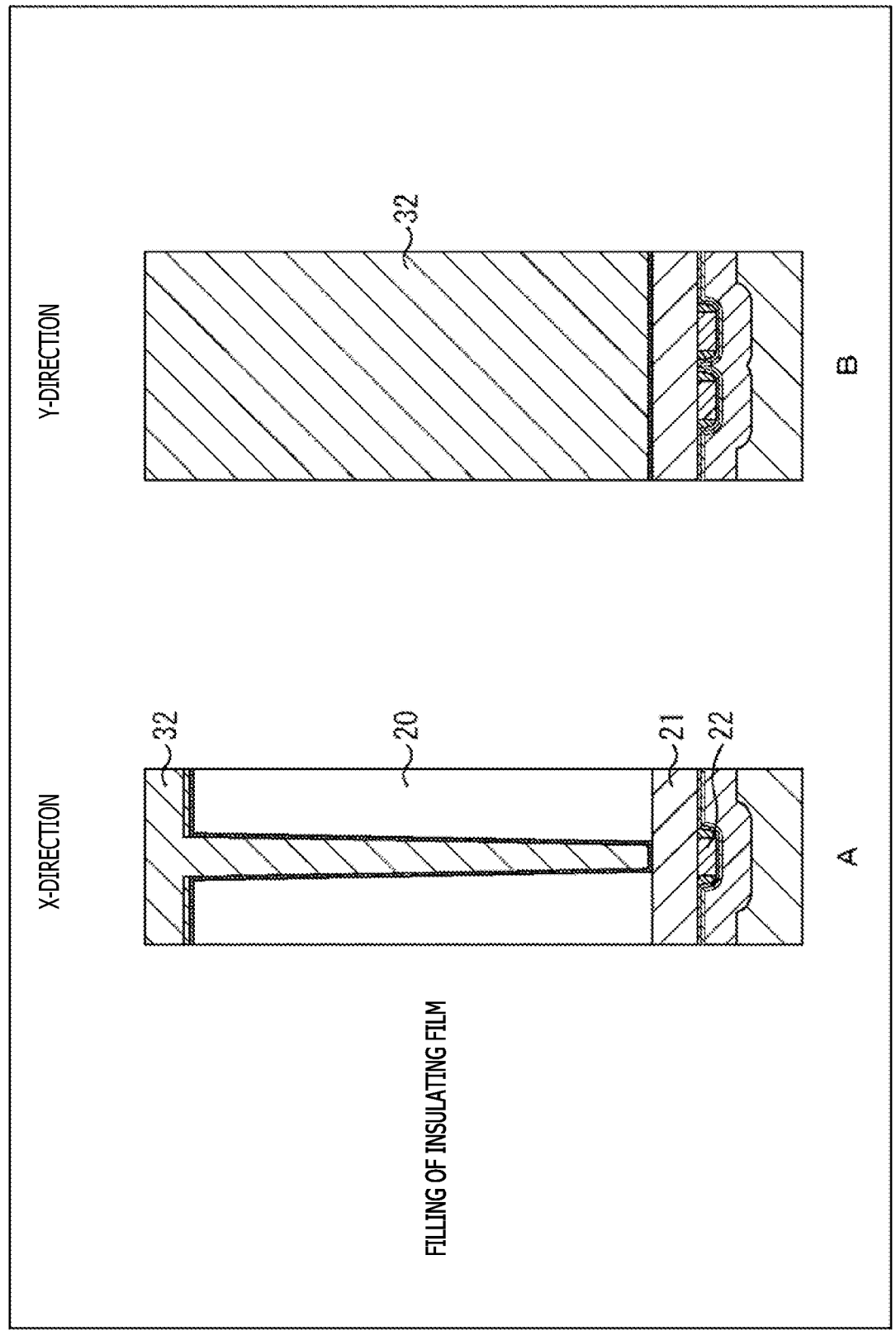
FIG. 5 depicts cross-sectional views illustrating the formation method of the trench structures and the through-electrodes.
Figure 6:
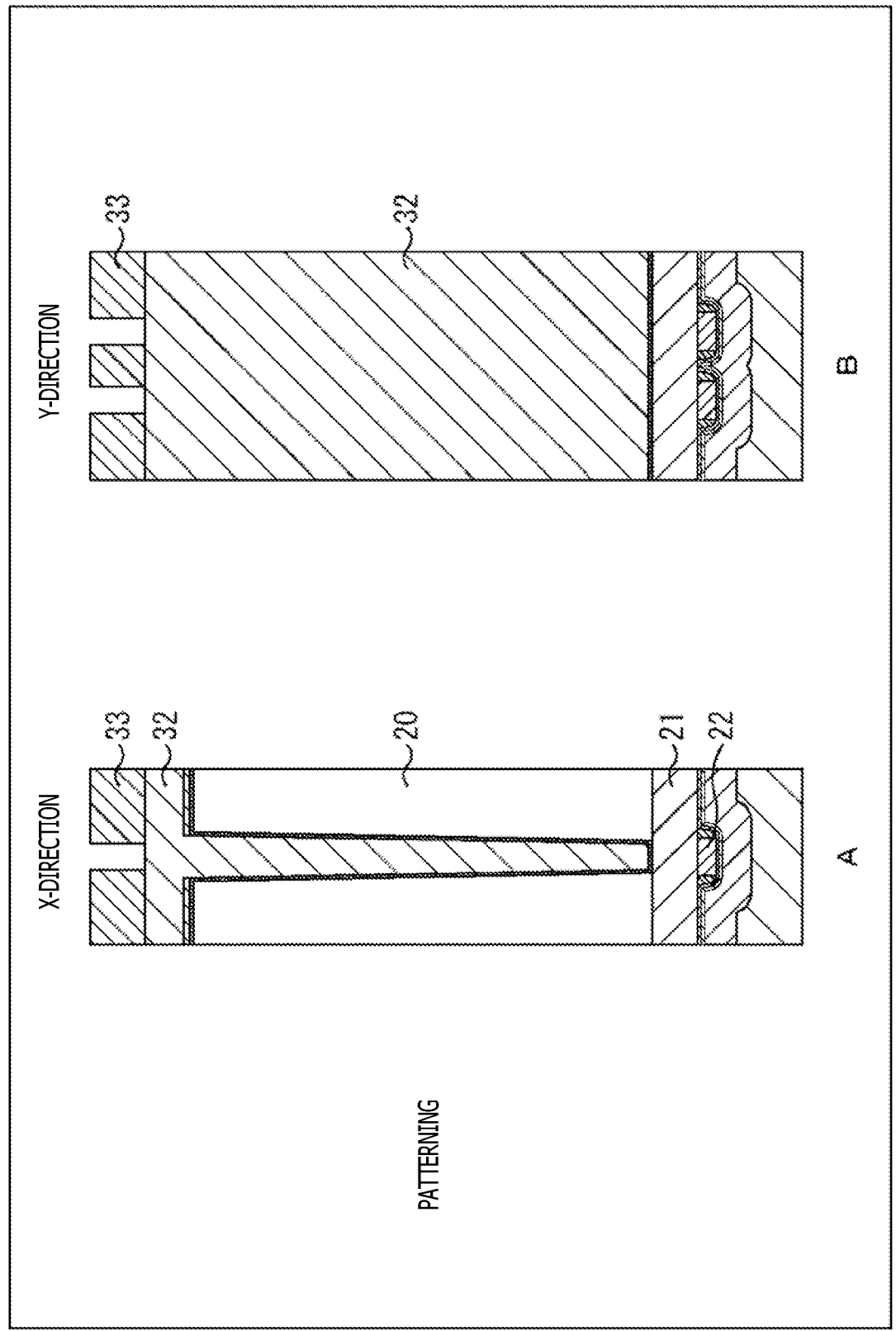
FIG. 6 depicts cross-sectional views illustrating the formation method of the trench structures and the through-electrodes.
Figure 7:
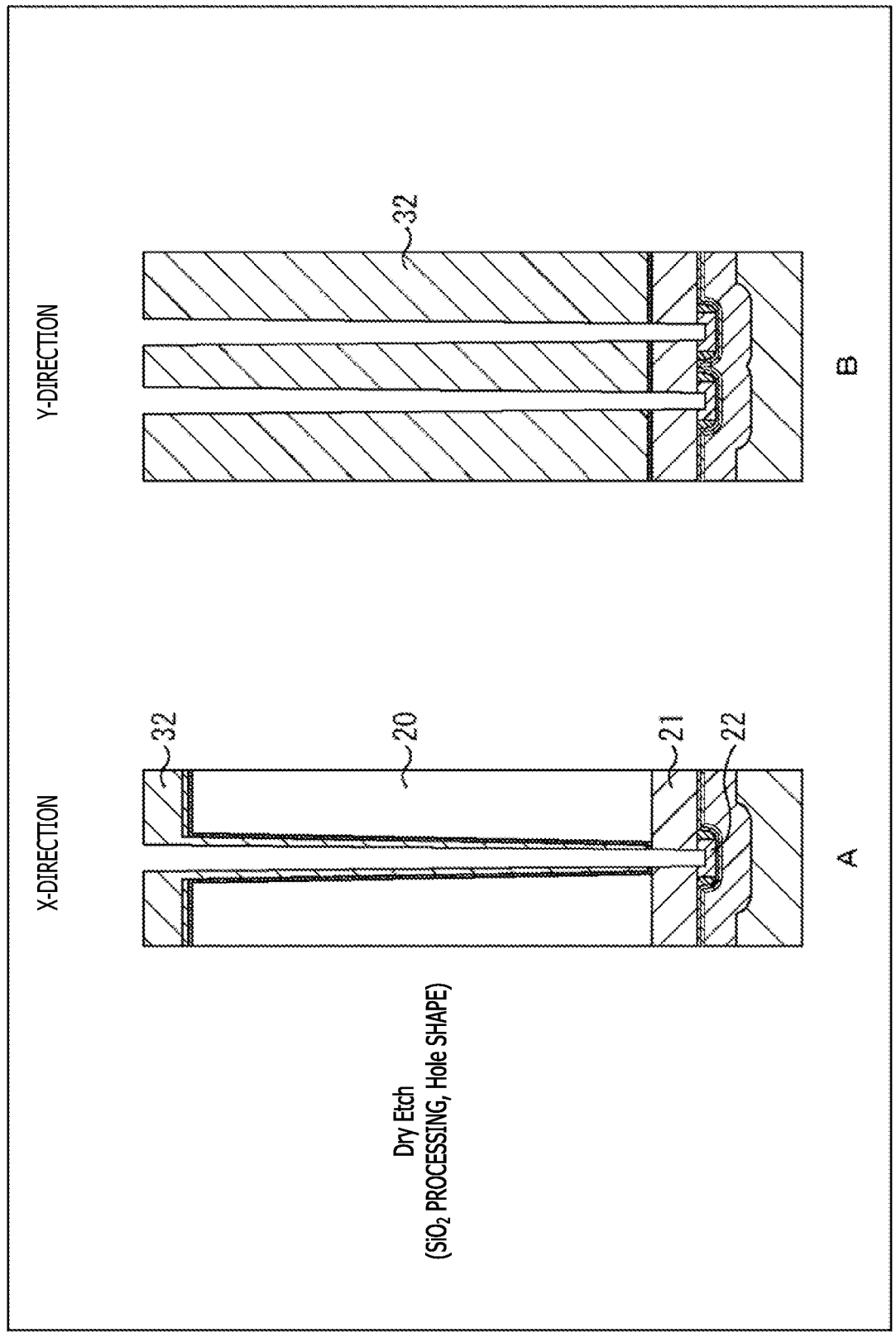
FIG. 7 depicts cross-sectional views illustrating the formation method of the trench structures and the through-electrodes.

Then, as illustrated in FIG. 5, an insulating film 32 of $SiO_2$, SiN or the like is filled, for example, by a method such as plasma CVD into the trenches formed in the Si substrate 20 in FIG. 4. Next, as illustrated in FIG. 6, lithographic patterning is conducted to cover, with a resist 33, the insulating film 32 except for positions where the through-electrodes 13 are to be provided overlapping the trench structures 11. Then, as illustrated in FIG. 7, the insulating film 32 and the STI 21 are processed by drying etching or the like to form holes at parts, where the insulating film 32 is not covered with the resist 33, until the holes extend to the poly electrode 22.

Figure 8:
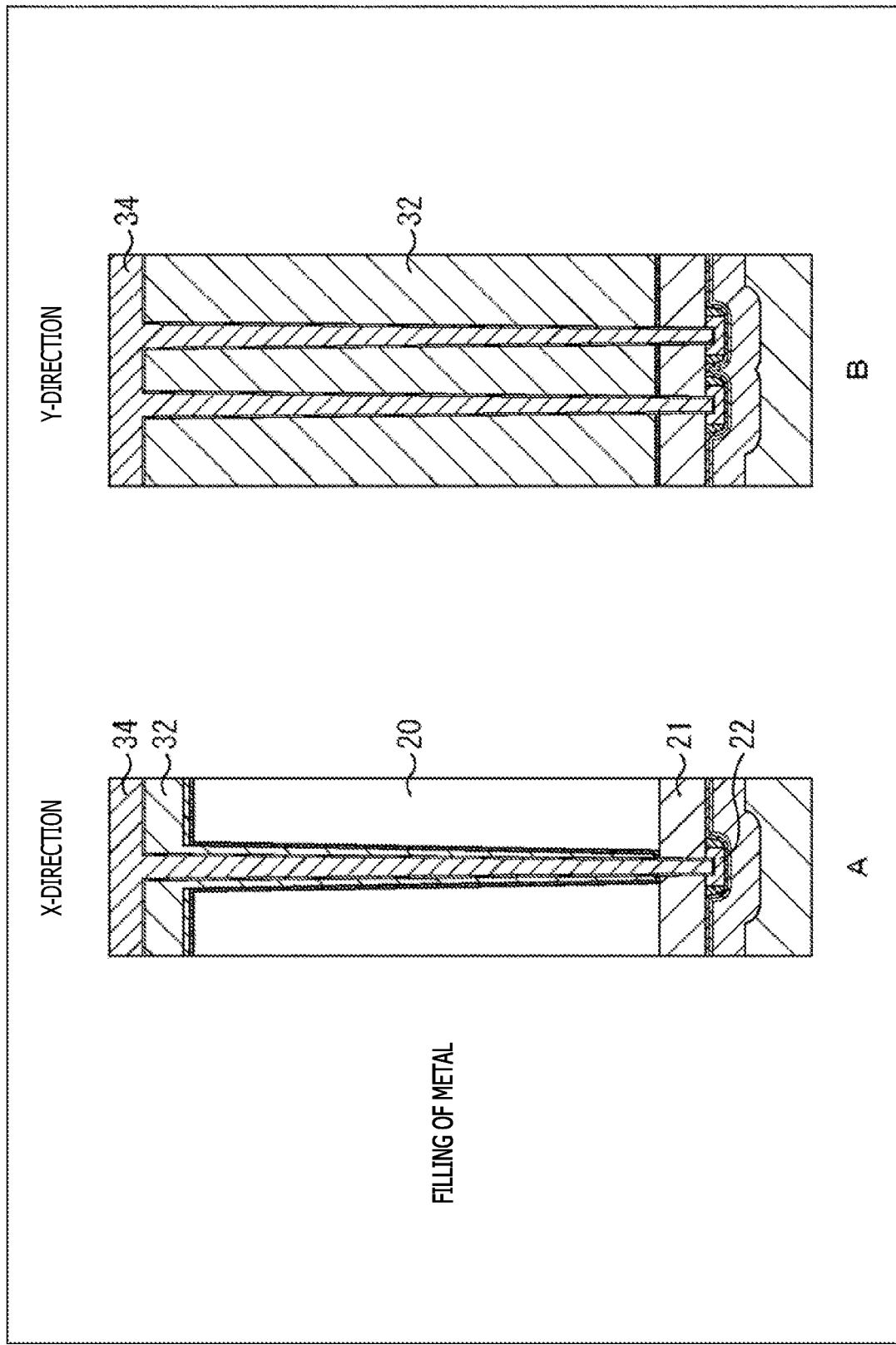
FIG. 8 depicts cross-sectional views illustrating the formation method of the trench structures and the through-electrodes.
Figure 9:
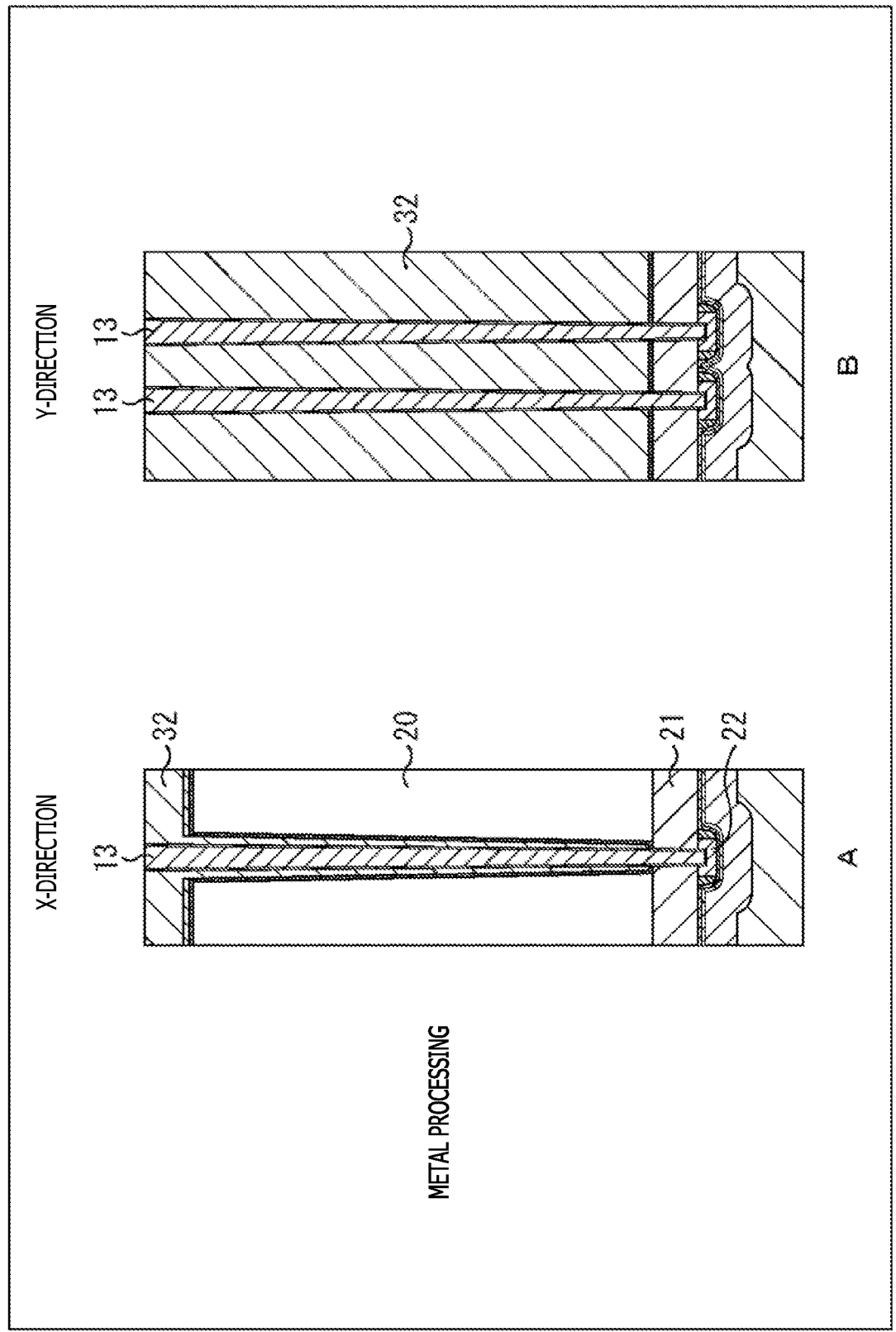
FIG. 9 depicts cross-sectional views illustrating the formation method of the trench structures and the through-electrodes.

Subsequently, as illustrated in FIG. 8, a metal 34 having conductivity, such as W, TiN, or Ti is filled, for example, by a method such as sputtering into the holes formed through the insulating film 32 and the STI 21 in FIG. 7, followed, as illustrated in FIG. 9, by removal of unnecessary portions of the filled metal 34 to form the through-electrodes 13.

By the above-described steps, the trench structures 11 and the through-electrodes 13 can be formed at the same time with the through-electrodes 13 being formed at the positions overlapping the trench structures 11.

It is to be noted that the trench structures 11 may be formed beforehand and the through-holes 13 may then be formed at positions overlapping the trench structures 11.

According to the solid state image sensor 10 by the first formation method described above, color mixing between adjacent pixels can be inhibited owing to the inclusion of the trench structures 11. In addition, the overlapping of the trench structures 11 and the through-holes 13 eliminates the need for the provision of regions exclusively for the through-electrodes 13, so that the solid state image sensor 10 can be reduced in size and the area of the PD at each pixel can be enlarged to make improvements in Qs and light-receiving sensitivity.

<Another Formation Method (Second Formation Method) of Trench Structures 11 and Through-Electrodes 13>

Figure 10:
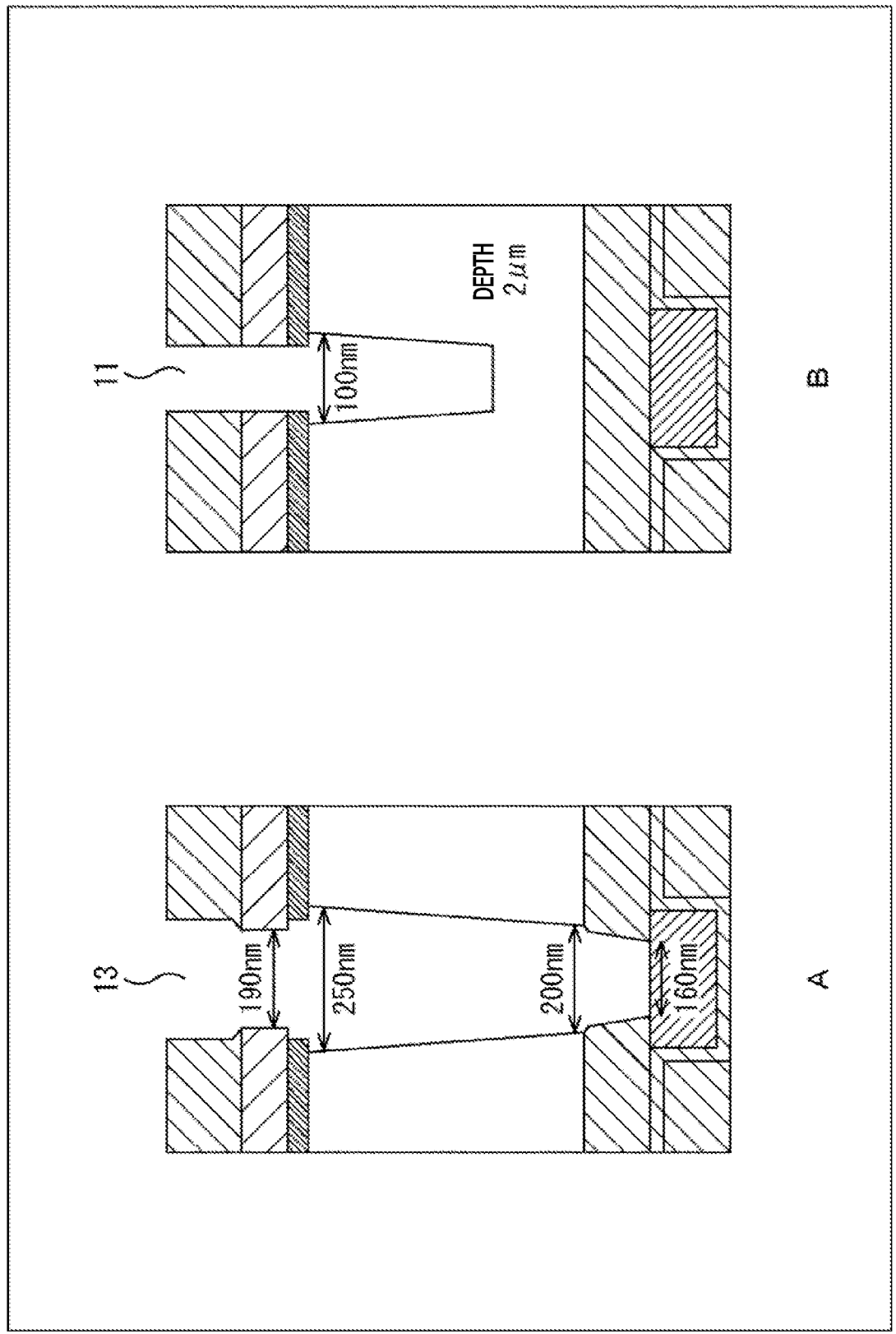
FIG. 10 depicts cross-sectional views illustrating another formation method of trench structures and through-electrodes.
Figure 11:
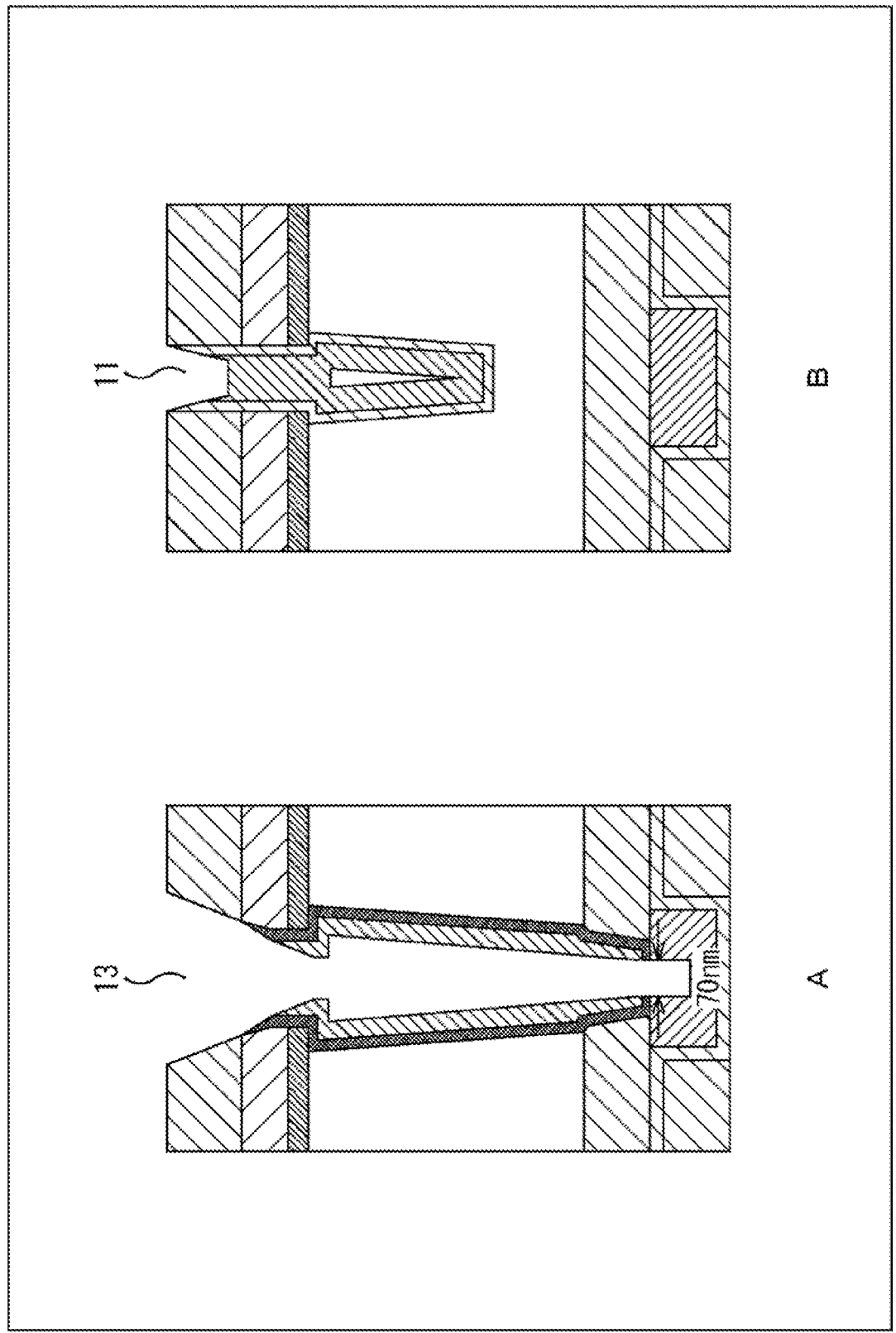
FIG. 11 depicts cross-sectional views illustrating the other formation method of the trench structures and the through-electrodes.
Figure 12:
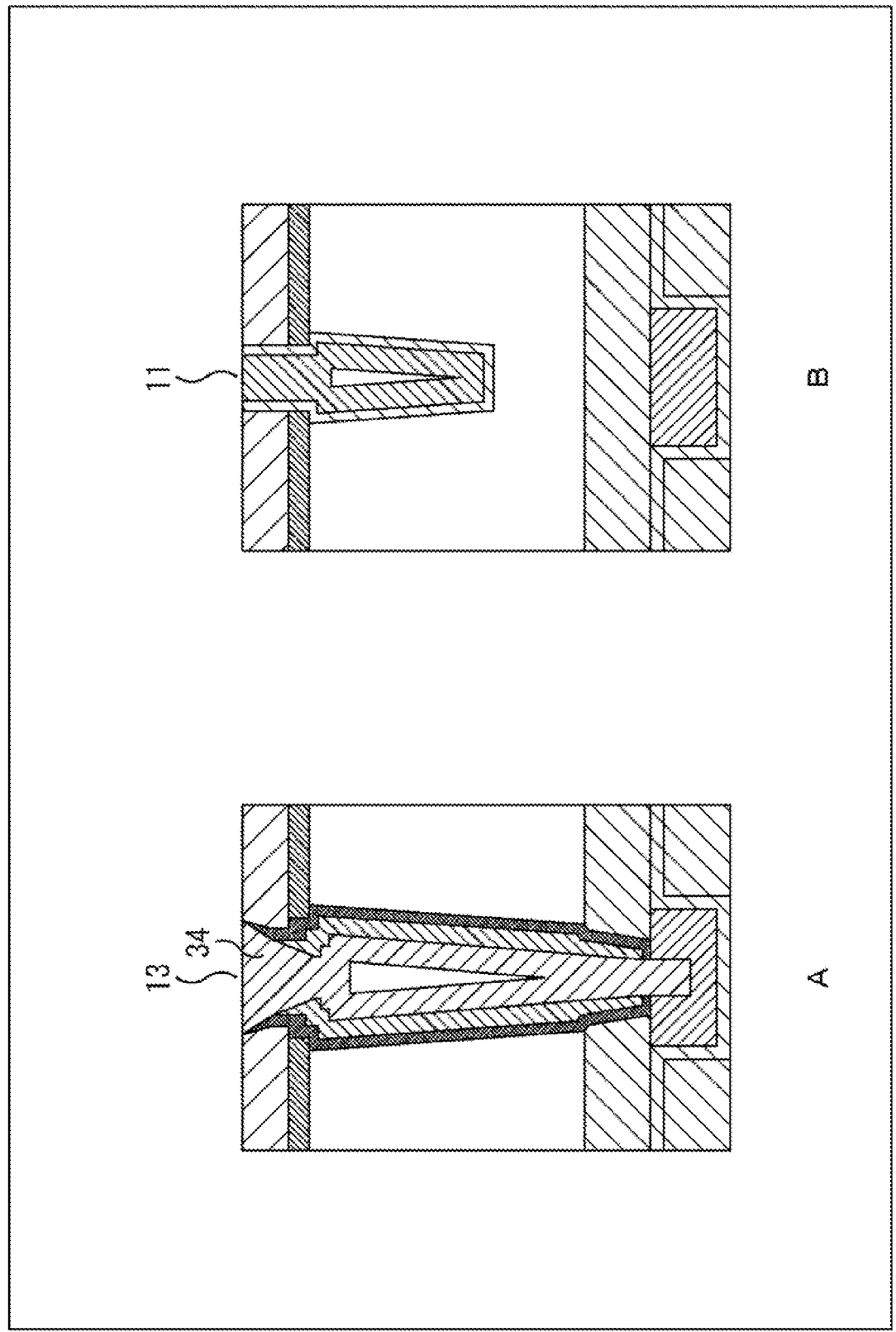
FIG. 12 depicts cross-sectional views illustrating the other formation method of the trench structures and the through-electrodes.

Next, FIG. 10 through FIG. 12 illustrate another formation method (second formation method) of trench structures 11 and through-electrodes 13 in a solid state image sensor 10.

In the second formation method, wider and deeper etching is conducted at positions where through-electrodes 13 are to be formed overlapping the trench structures 11 than at positions where only the trench structures 11 are to be formed. Described specifically, the layout dimensions (the widths of lines not covered with the resist 31) of the trench structures 11, the trench structure crosspoints 12, and the through-electrodes 13 are set so that the through-electrodes 13 are widest, the trench structure crosspoints 12 are less wide, and the trench structures (straight portions) 11 are narrowest.

Layout Dimensions:

through-electrodes 13>trench structure crosspoints 12>trench structures (straight portions) 11

On the other hand, the depths when the Si substrate 20 is processed to form trenches and holes upon formation of the trench structures 11, the trench structure crosspoints 12, and the through-electrodes 13 in the solid state image sensor 10 are set so that the through-electrodes 13 are deepest, the trench structure crosspoints 12 are less deep, and the trench structures (straight portions) 11 are shallowest.

Depths Upon Processing:

through-electrodes 13>trench structure crosspoints 12>trench structures (straight portions) 11

Figure 13:
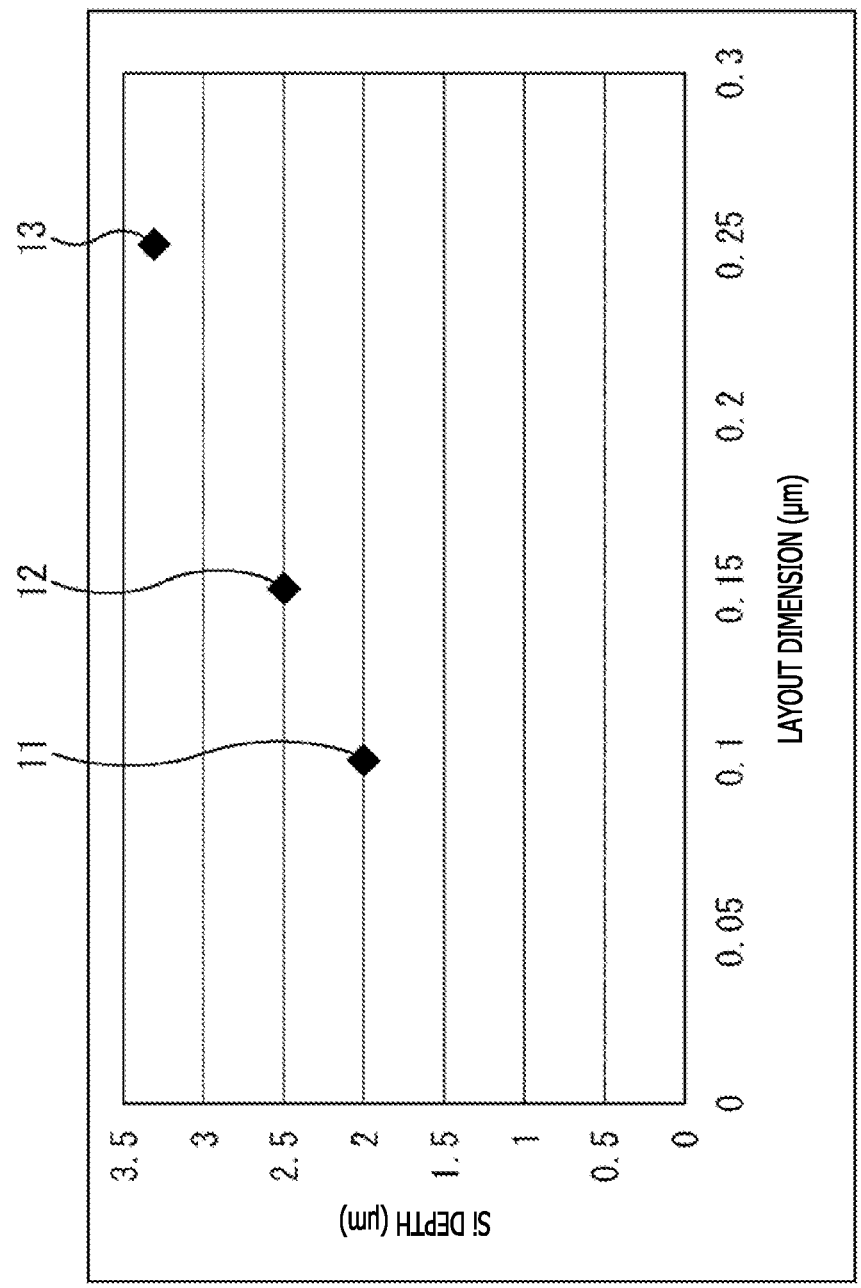
FIG. 13 is a table presenting layout dimensions and processing depths of trench structures, trench structure crosspoints, and through-electrodes.

FIG. 13 presents examples of layout dimensions and processing depths of the trench structures 11, the trench structure crosspoints 12, and the through-electrodes 13. It should, however, be borne in mind that the specific numerical values of the layout dimensions and depths as described in the figure are merely illustrative and vary depending on the overall size and hole ratio of the solid state image sensor 10.

If the layout dimensions and processing depths of the trench structures 11, the trench structure crosspoints 12, and the through-electrodes 13 are set according to the above-mentioned magnitude relationship, they can be efficiently arranged or can be formed at the same time.

<Further Formation Method (Third Formation Method) of Trench Structures 11 and Trough-Electrodes 13>

A description will next be made about a further formation method (third formation method) of trench structures 11 and through-electrodes 13 in a solid state image sensor 10.

Figure 14:
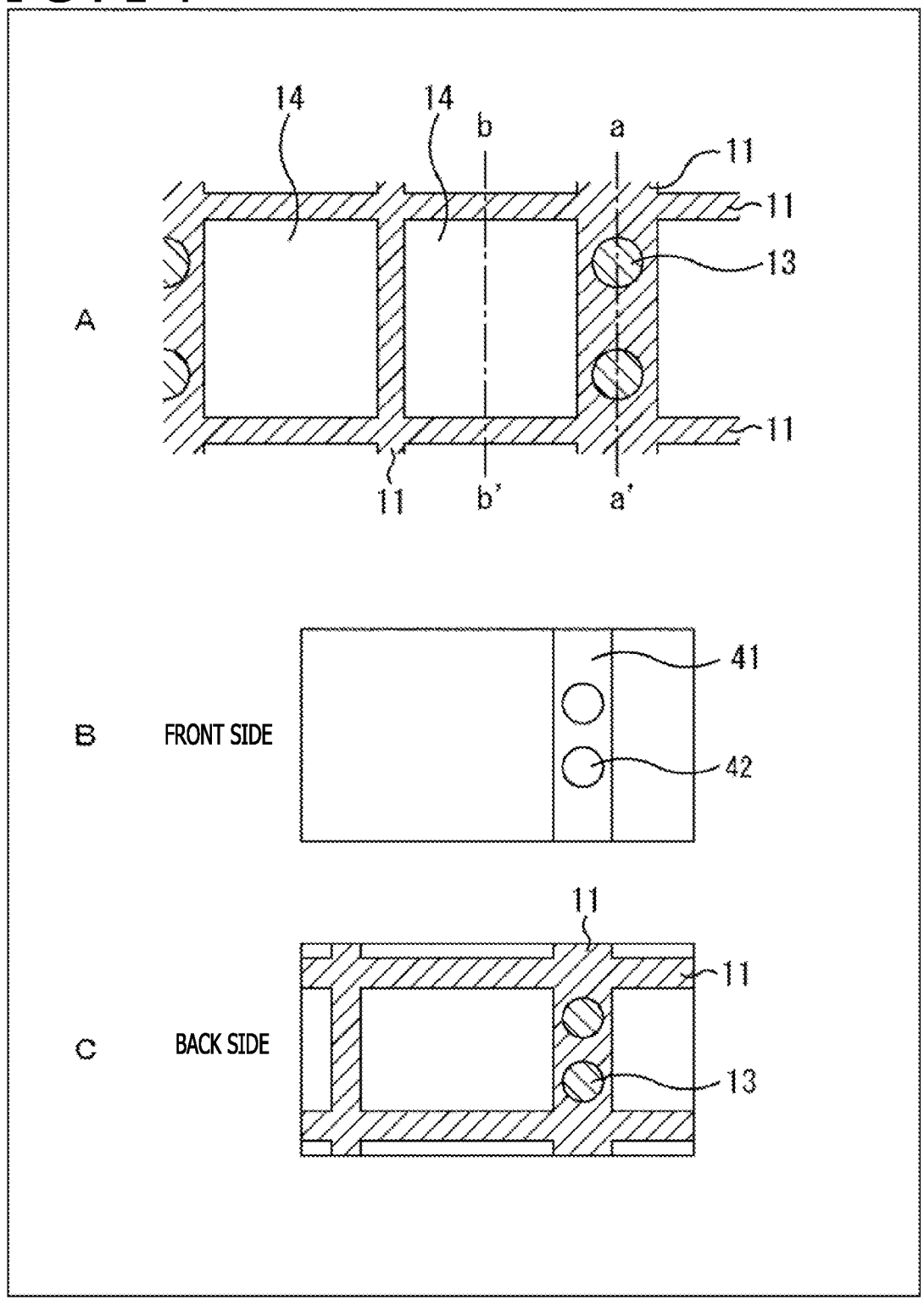
FIG. 14 depicts plan views of a solid state image sensor in which through-electrodes and trench structures are provided side by side.

FIG. 14 depicts views provided to describe the third formation method, in which A of FIG. 14 is a plan view of the solid state image sensor 10, B of FIG. 14 illustrates the configuration of a front surface (a surface opposite to a surface through which light enters) of the Si substrate 20 in the solid state image sensor 10, and C of FIG. 14 illustrates the configuration of a back surface (the surface through which light enters) of the Si substrate 20 in the solid state image sensor 10.

The third formation method of the trench structures 11 and the through-electrodes 13 will be described hereinafter. With reference to B of FIG. 14, in a front side of the Si substrate 20, a DTI (Deep Trench Isolation) 41 is formed, and poly electrodes 42 are formed corresponding to the positions of the through-electrodes 13. Referring to C of FIG. 14, on the other hand, in a back side of the Si substrate 20, trench structures 11 formed from an insulating film 44 and the through-electrodes 13 made of a metal 43 are formed.

Figure 15:
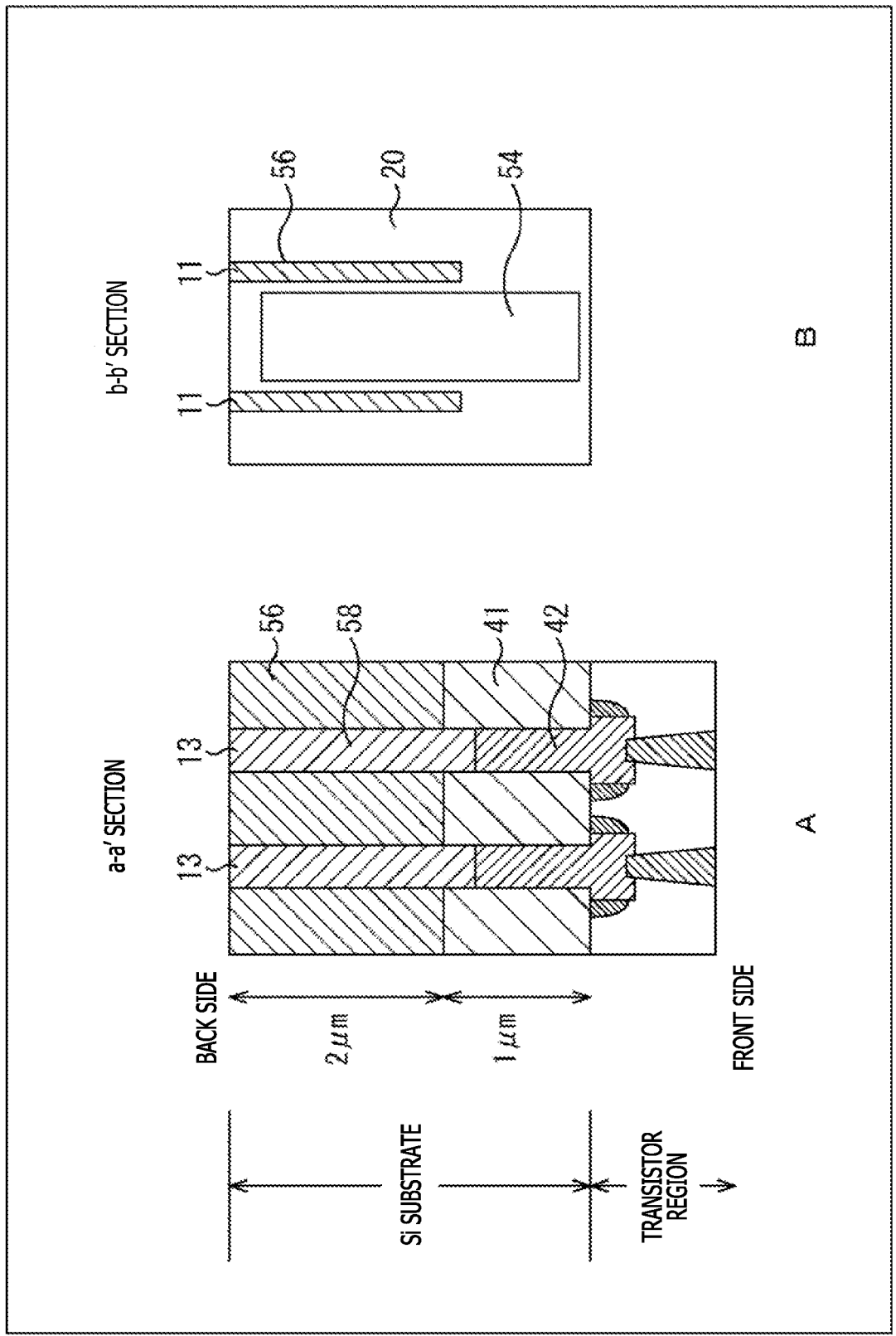
FIG. 15 depicts cross-sectional views corresponding to FIG. 14.

FIG. 15 depicts cross-sectional views corresponding to A of FIG. 14. A of FIG. 15 corresponds to a part along line a-a' in A of FIG. 14, where a trench structure 11 and through-electrodes 13 are to be formed overlapping each other. B of FIG. 15 corresponds to a part along line b-b' in A of FIG. 14, where the trench structure 11 is to be formed. It is to be noted that in FIG. 15, the upper side in the figure is the back surface (the surface through which light enters) of the solid state image sensor 10 and the lower side in the figure is the front surface of the solid state image sensor 10.

The trench structure 11 is formed from the insulating film 44 formed from the back side as illustrated in A of FIG. 15 and B of FIG. 15. On the other hand, the through-electrodes 13 are formed from the poly electrodes 42, which have been formed from the front side, and the metal 43, which has been filled between walls of the insulating film 44, connected each other as illustrated in A of FIG. 15.

Next, FIG. 16 through FIG. 30 specifically illustrate the third formation method. It is to be noted that each figure number labeled with suffix "A" and each figure number labeled with suffix "B" correspond to A of FIGS. 15 and B of FIG. 15, respectively. It is to be noted that in FIG. 16 through FIG. 22, the upper side in each figure is a front surface of the solid state image sensor 10 and the lower side in each figure is a back surface of the solid state image sensor 10. It is also to be noted that in FIG. 23 through FIG. 30, the upper side in each figure is the back surface of the solid state image sensor 10 and the lower side in each figure is the front surface of the solid state image sensor 10.

Figure 16:
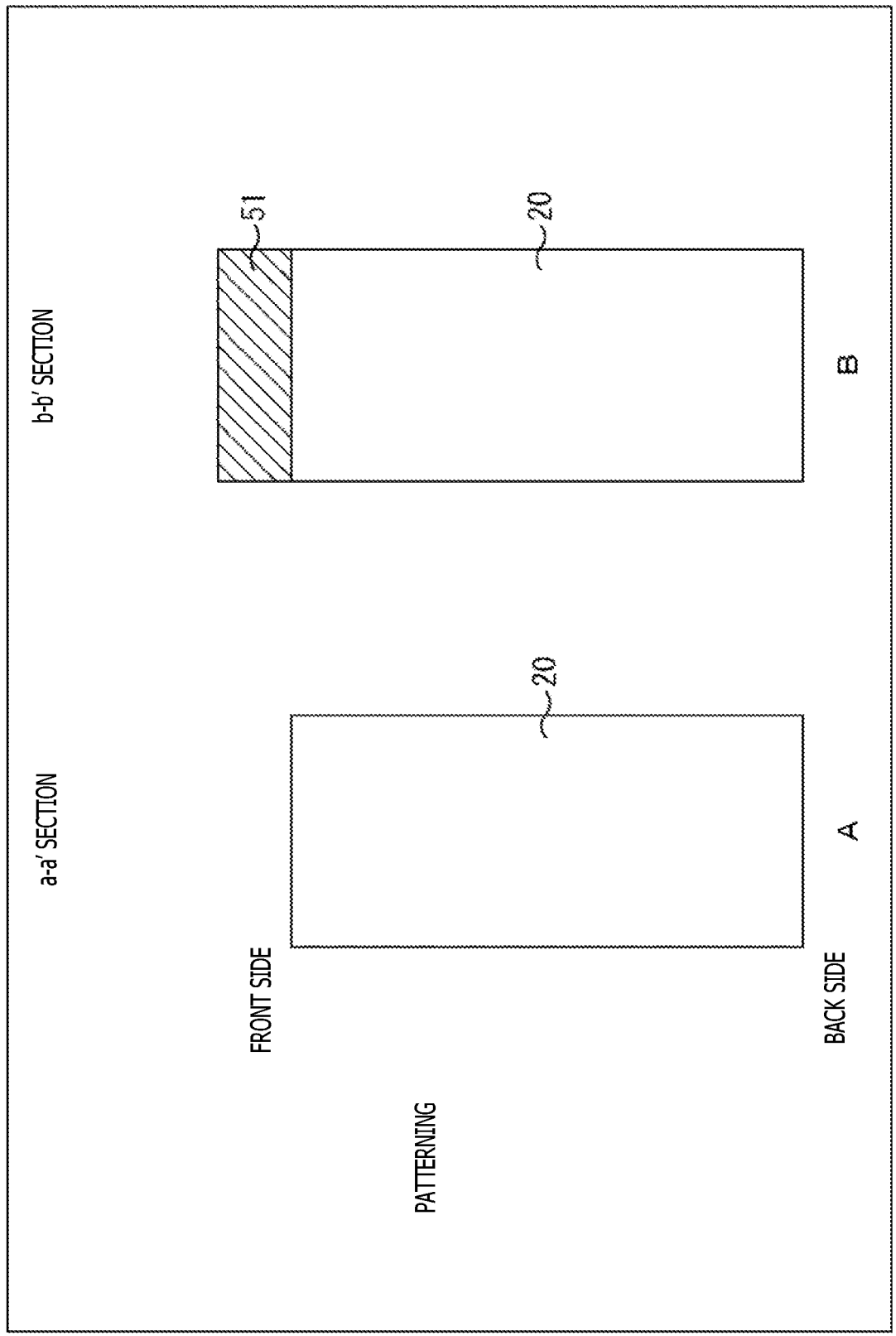
FIG. 16 depicts cross-sectional views illustrating a further formation method of trench structures and through-electrodes.
Figure 17:
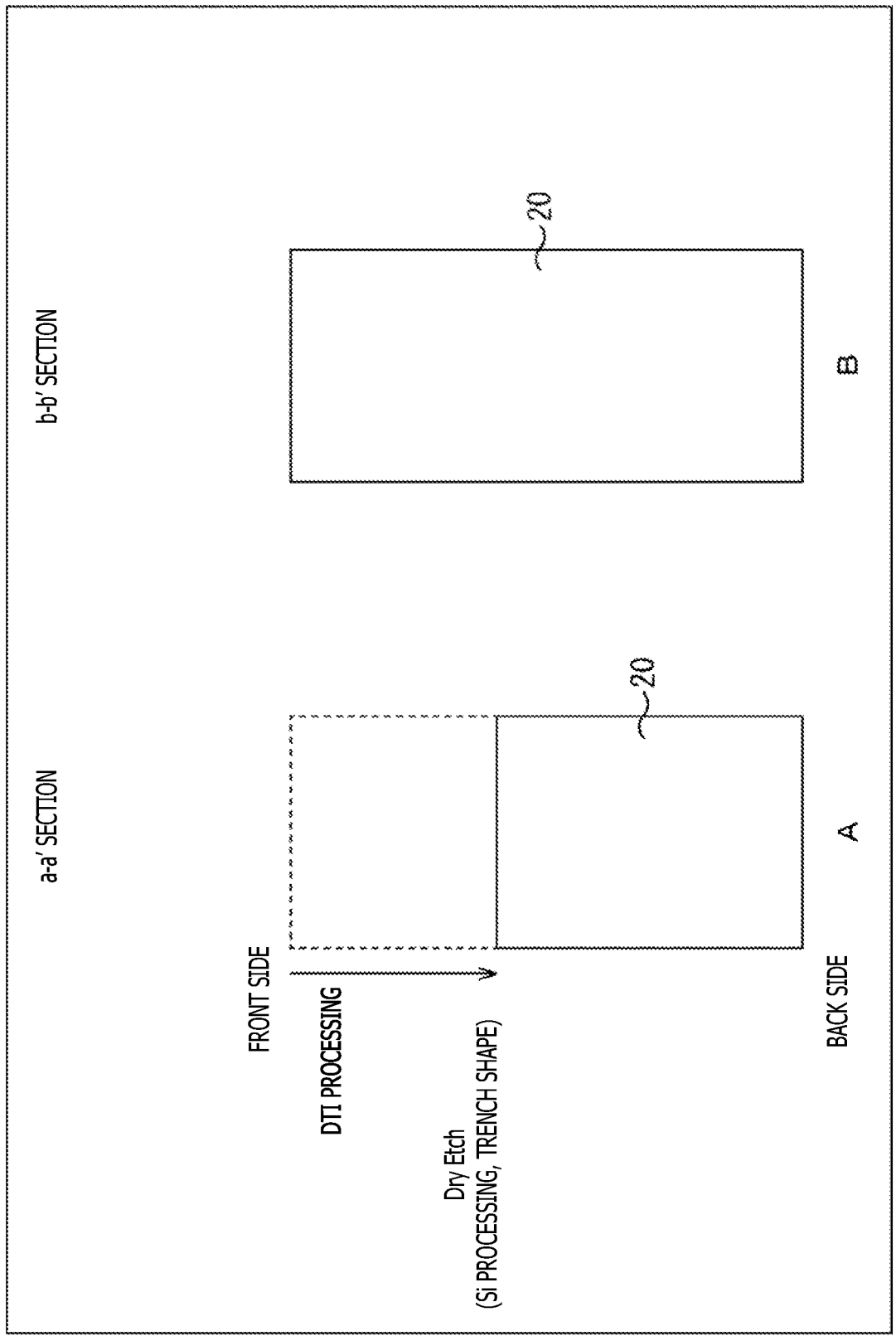
FIG. 17 depicts cross-sectional views illustrating the further formation method of the trench structures and the through-electrodes.
Figure 18:
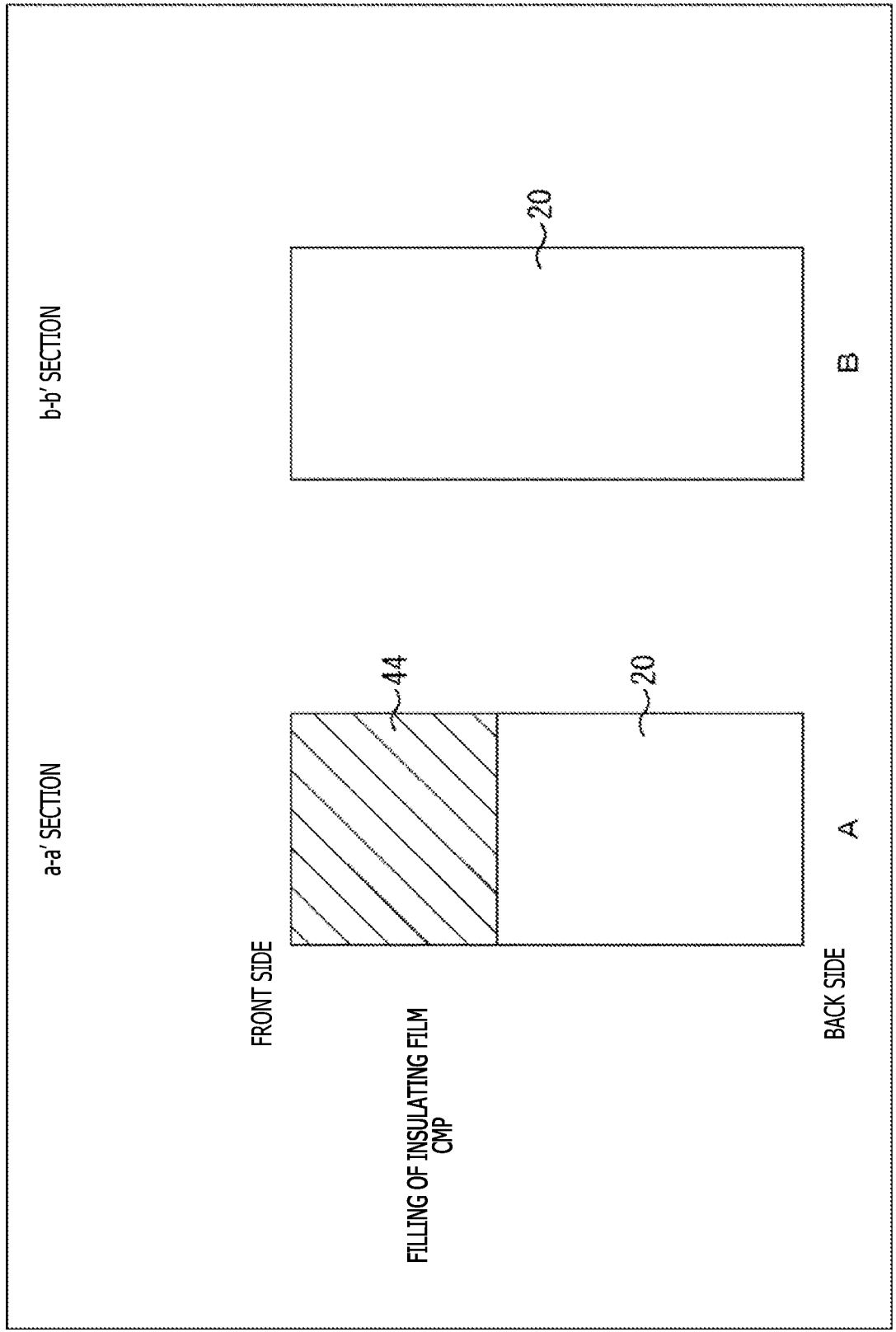
FIG. 18 depicts cross-sectional views illustrating the further formation method of the trench structures and the through-electrodes.

Firstly, the DTI 41 is formed on the front side of the Si substrate 20. Described specifically, as illustrated in FIG. 16, a resist 51, which covers the front surface of the Si substrate 20 except for a trench where the DTI 41 is to be formed, is patterned by lithography. Then, as illustrated in FIG. 17, a trench is formed as deep as approximately 1 μm by dry etching or the like from the front side of the Si substrate 20. Then, as illustrated in FIG. 18, the insulating film 44 such as an oxide film is filled in the formed trench by CVD (chemical vapor deposition) or the like, and unnecessary portions of the insulating film 44 on the front surface of the Si substrate 20 are polished by CMP (chemical mechanical polishing) or the like to form the DTI 41.

Figure 19:
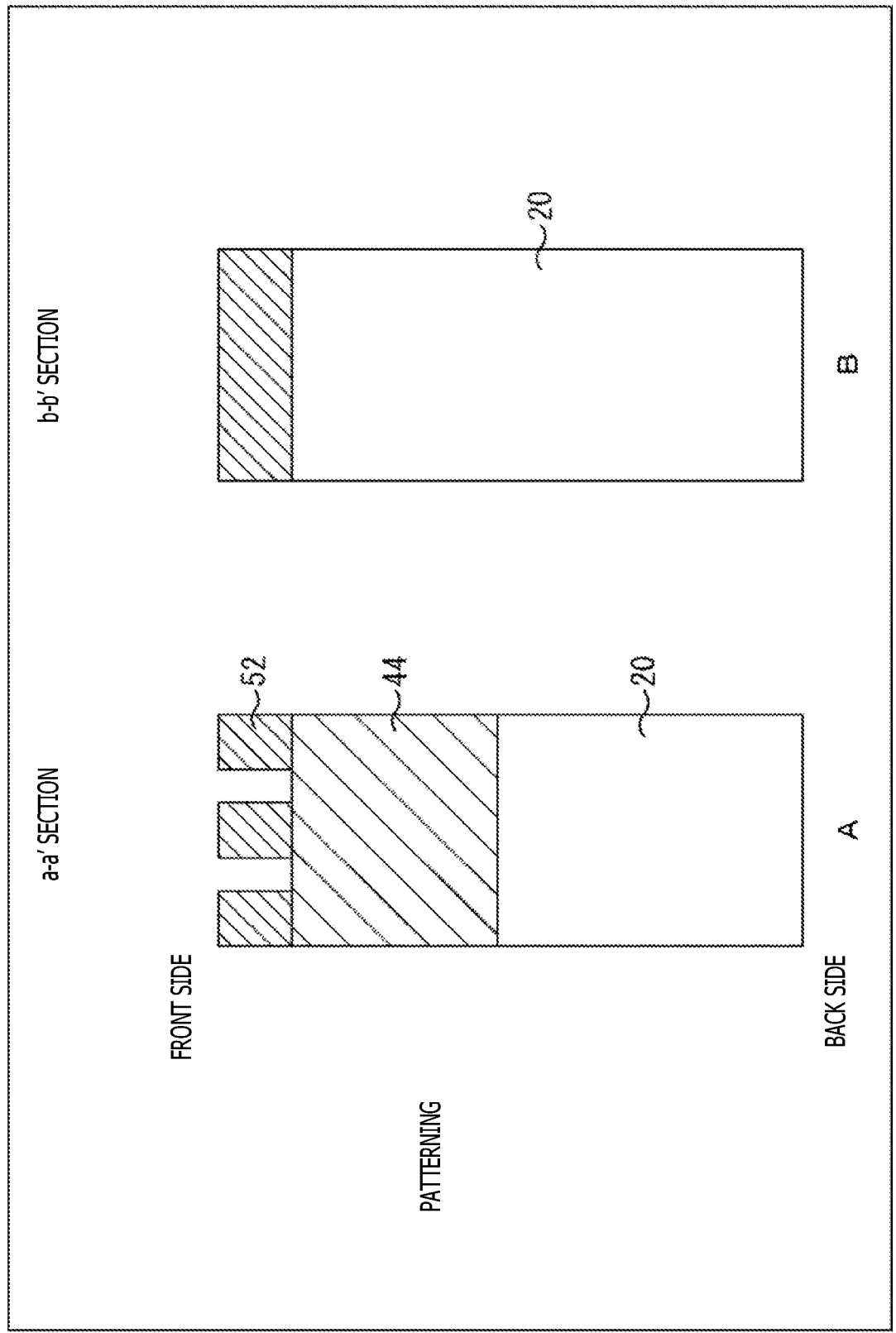
FIG. 19 depicts cross-sectional views illustrating the further formation method of the trench structures and the through-electrodes.
Figure 20:
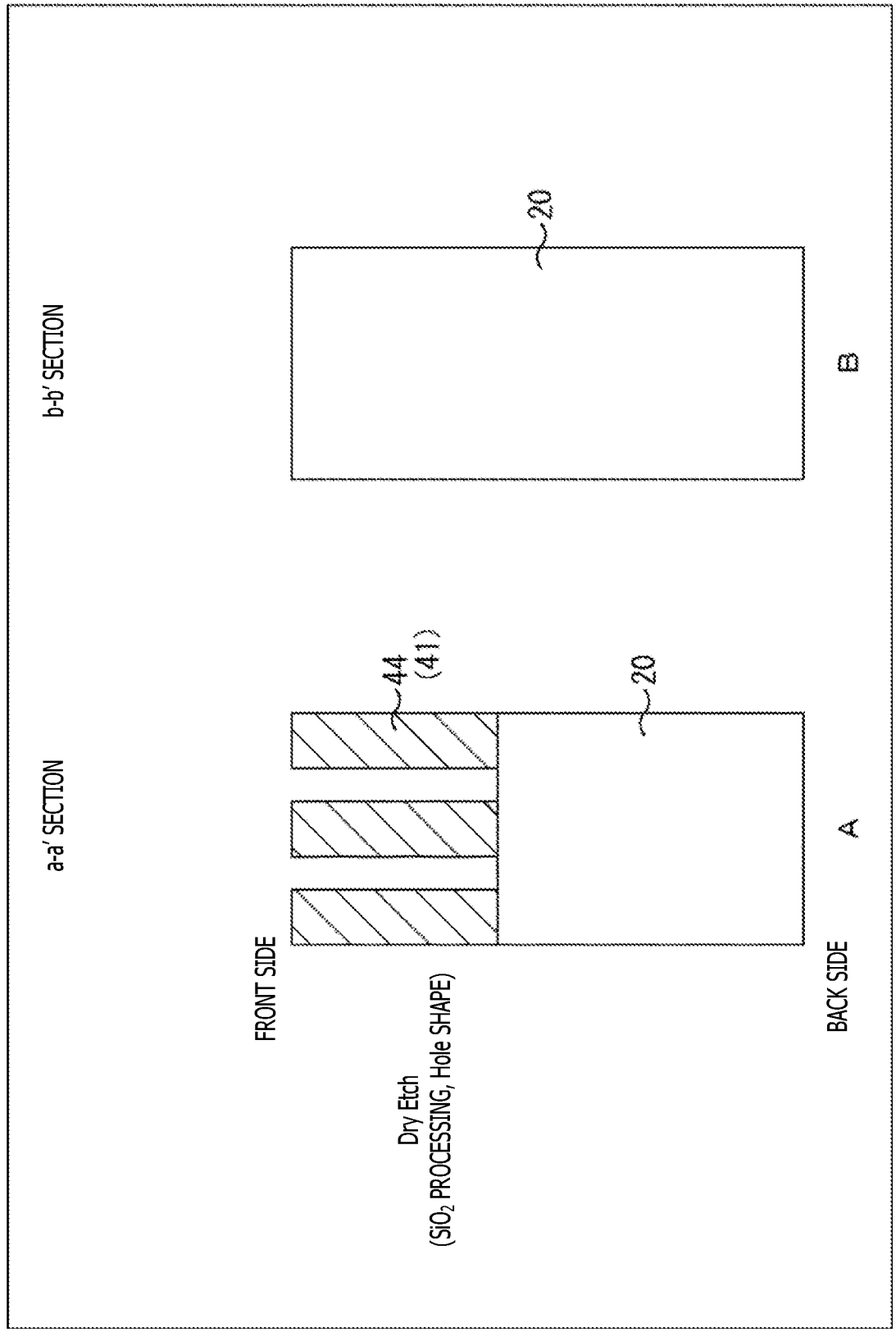
FIG. 20 depicts cross-sectional views illustrating the further formation method of the trench structures and the through-electrodes.
Figure 21:
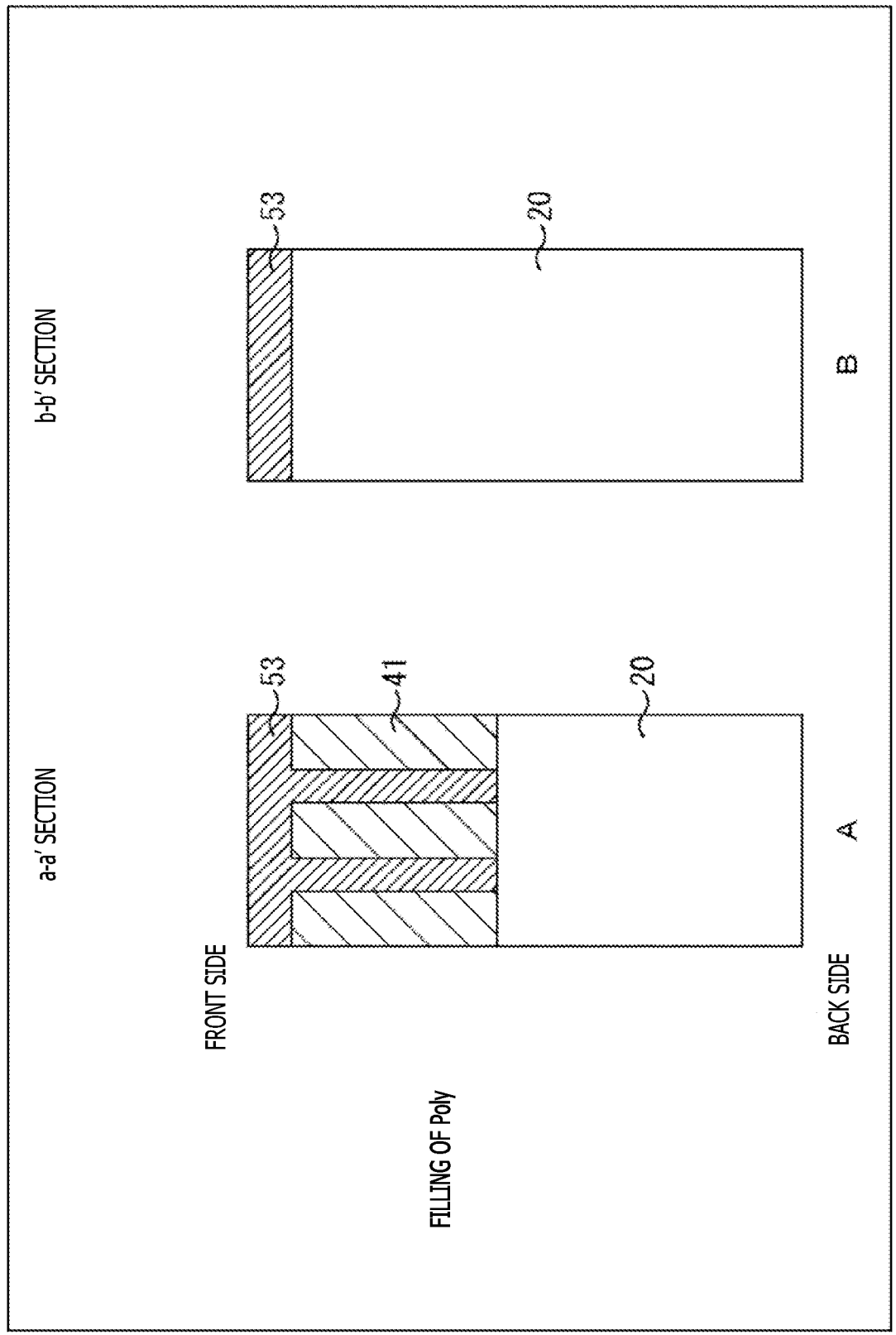
FIG. 21 depicts cross-sectional views illustrating the further formation method of the trench structures and the through-electrodes.
Figure 22:
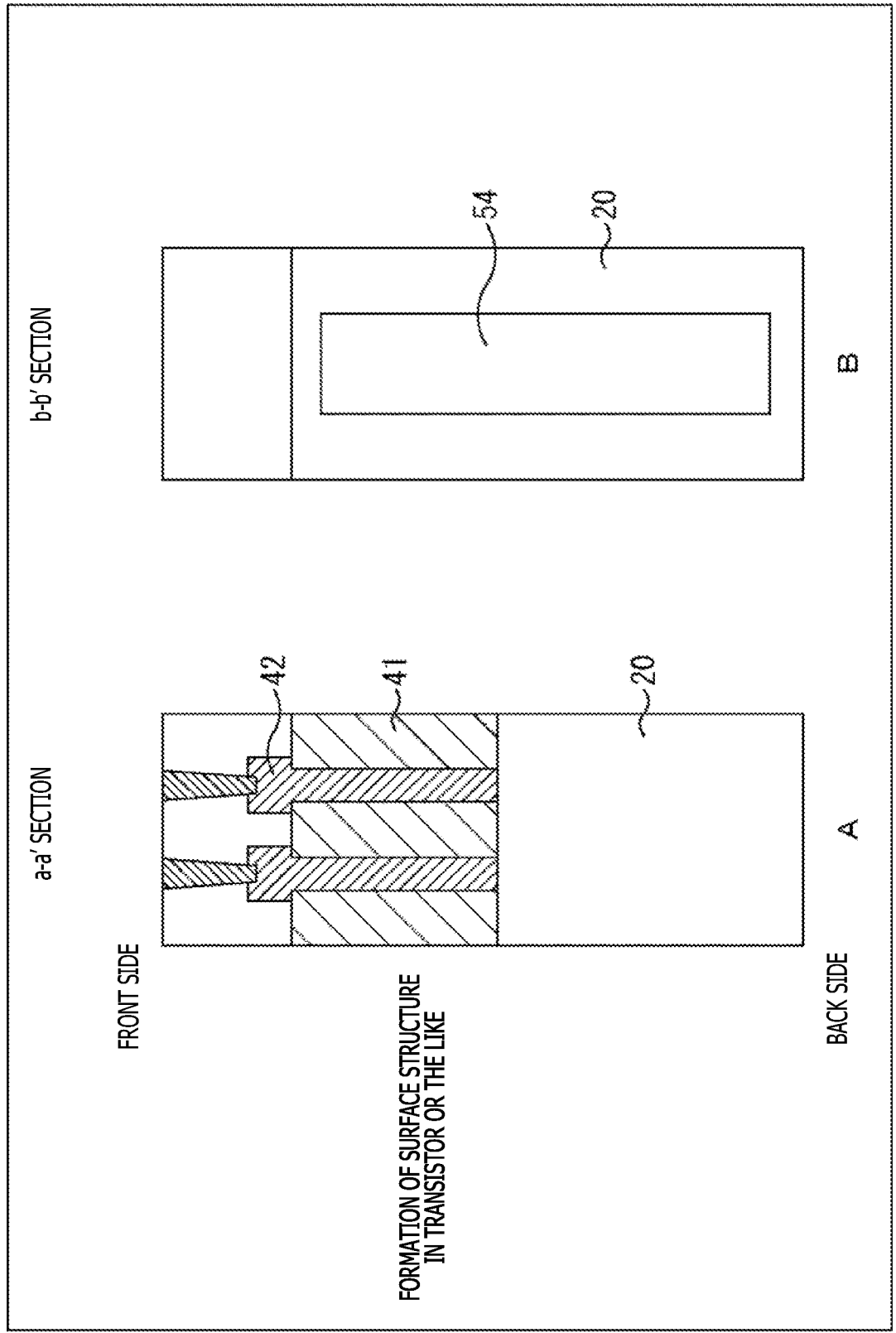
FIG. 22 depicts cross-sectional views illustrating the further formation method of the trench structures and the through-electrodes.

Next, the poly electrodes 42 are formed in the formed DTI 41. Described specifically, as illustrated in FIG. 19, a resist 52 is patterned by lithography to cover the insulating film 44 except for positions corresponding to holes where the poly electrodes 42 are to be formed. Then, as illustrated in FIG. 20, the DTI 41 (insulating film 44) is processed by dry etching or the like to form holes. Further, as illustrated in FIG. 21, a conductive film 53 such as, for example, a doped poly-Si or metal film is formed by CVD or the like from the front side of the Si substrate 20, whereby the formed holes are filled with the conducive film 53. Furthermore, as illustrated in FIG. 22, the poly electrodes 42 are formed by forming a necessary structure in a transistor region on the front side of the Si substrate 20. It is to be assumed that a photoelectric conversion section 54 such as a PD has been formed in an inner part of the Si substrate 20, the inner part being surrounded by the trench structure 11, until this step as illustrated in B of FIG. 22.

Figure 23:
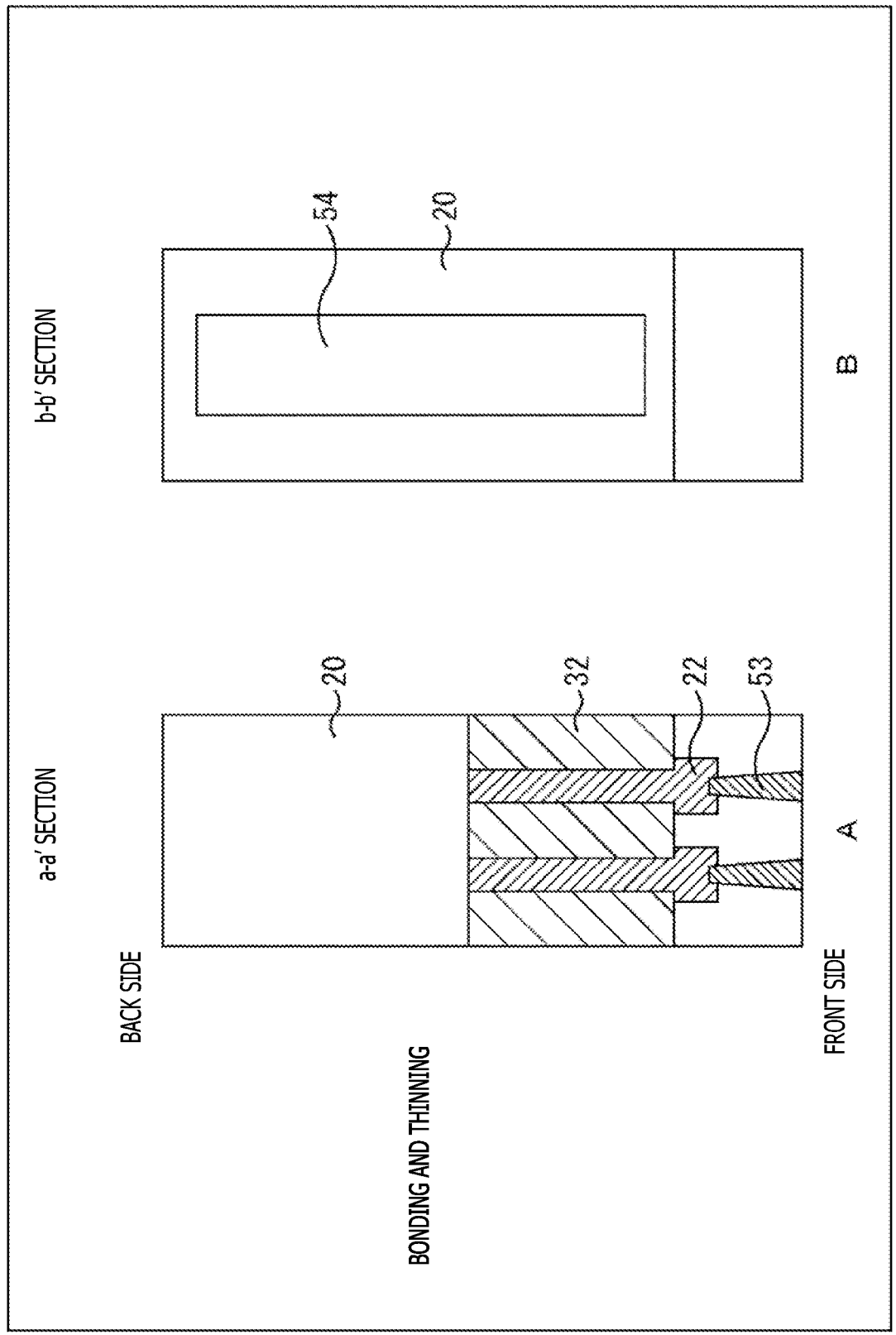
FIG. 23 depicts cross-sectional views illustrating the further formation method of the trench structures and the through-electrodes.
Figure 24:
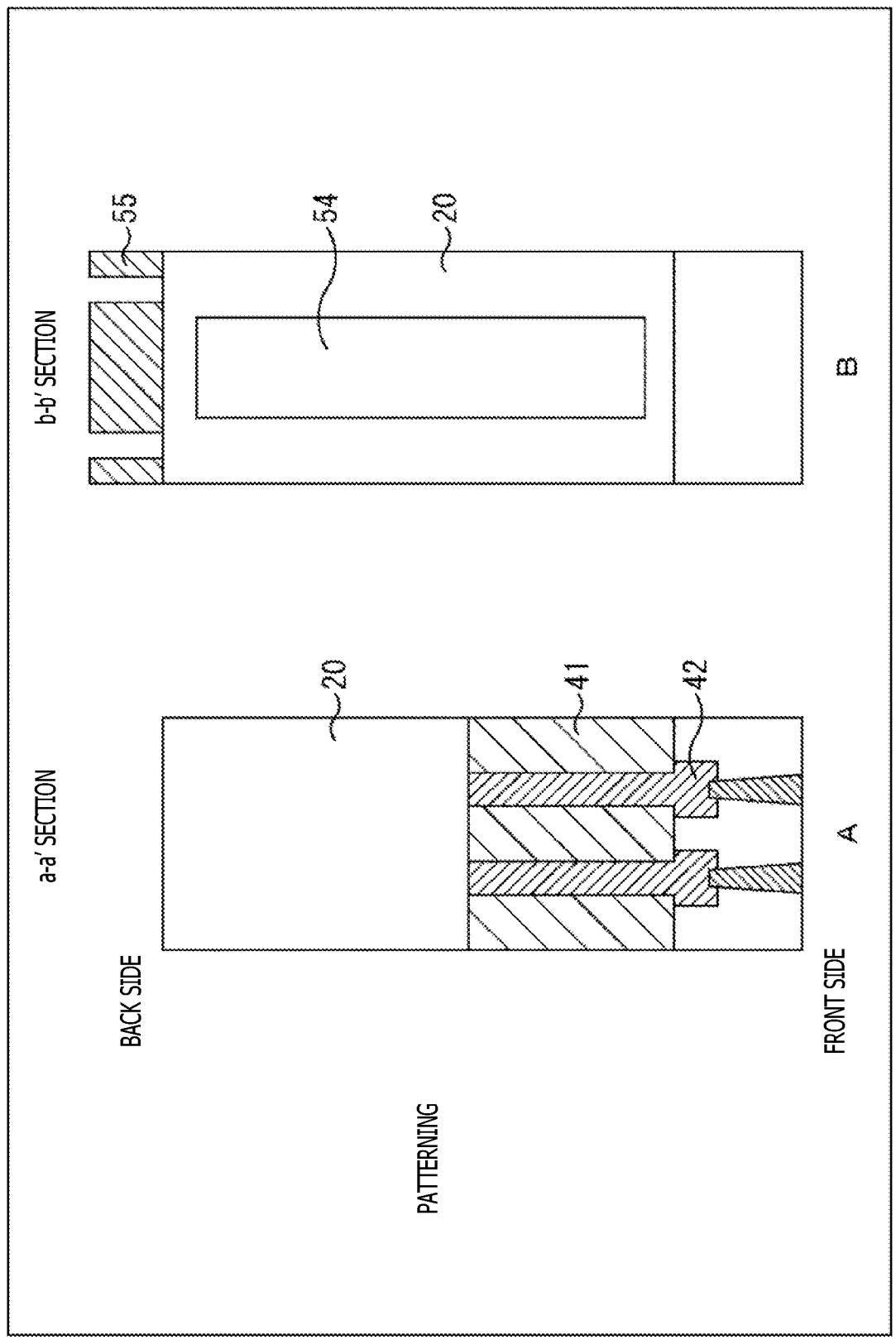
FIG. 24 depicts cross-sectional views illustrating the further formation method of the trench structures and the through-electrodes.
Figure 25:
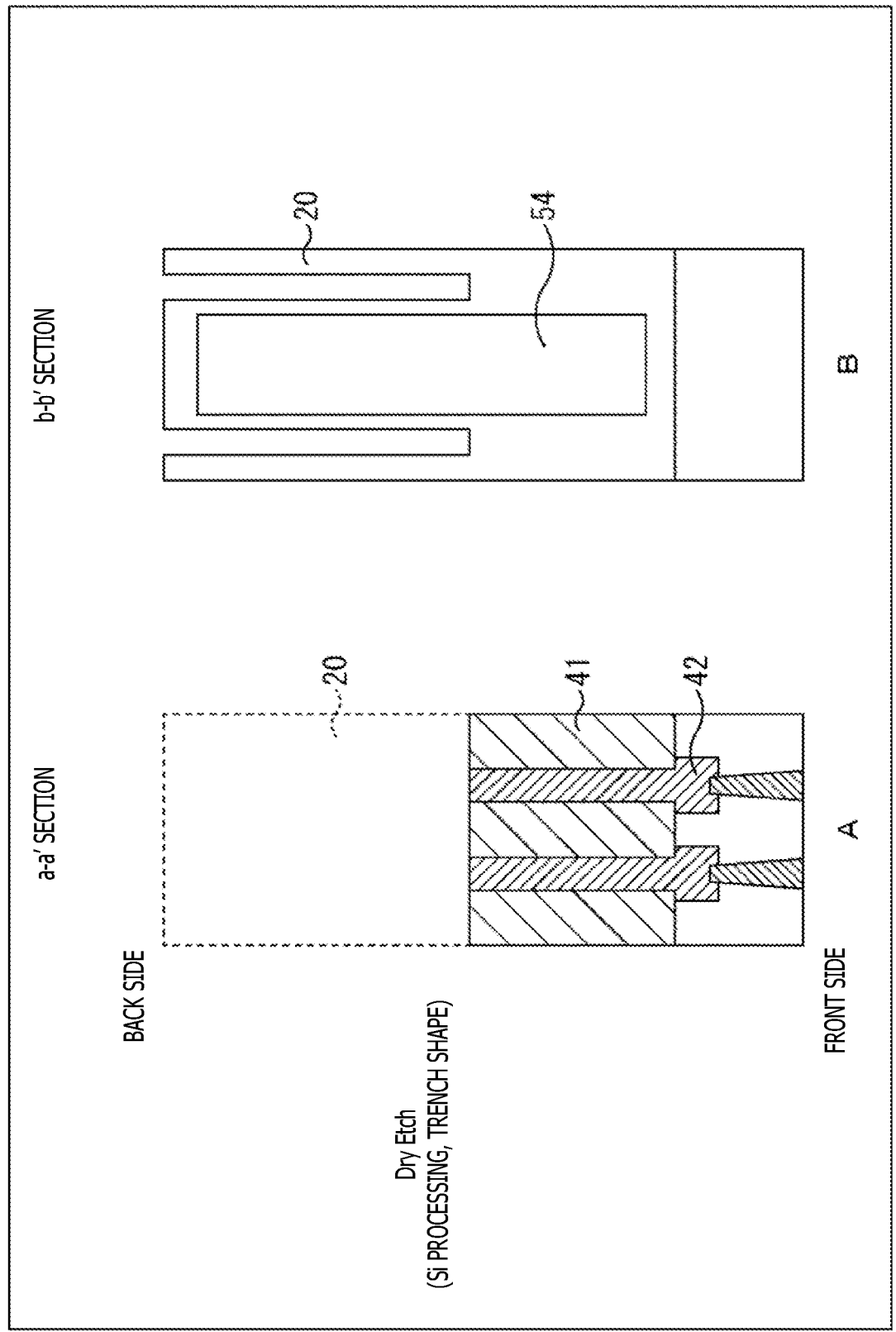
FIG. 25 depicts cross-sectional views illustrating the further formation method of the trench structures and the through-electrodes.

Next, a metal is filled from the back side of the Si substrate 20 and is connected to the poly electrodes 42 to form the through-electrodes 13. Described specifically, after reversing the front and back sides of the Si substrate 20 as illustrated in FIG. 23, a resist 55 is patterned by lithography so that as illustrated in FIG. 24, the Si substrate 20 is covered with the resist 55 except for positions where the trench structure 11 is to be formed (including positions where the through-electrodes 13 are to be formed). Then, as illustrated in FIG. 25, the Si substrate 20 is processed by dry etching or the like to form trenches in a grid pattern. This dry etching is stopped at the insulating film 44 of the DTI 41 formed beforehand. In addition, trenches for the through-electrodes and trenches for interpixel light-shielding RDTIs are also formed at the same time.

Figure 26:
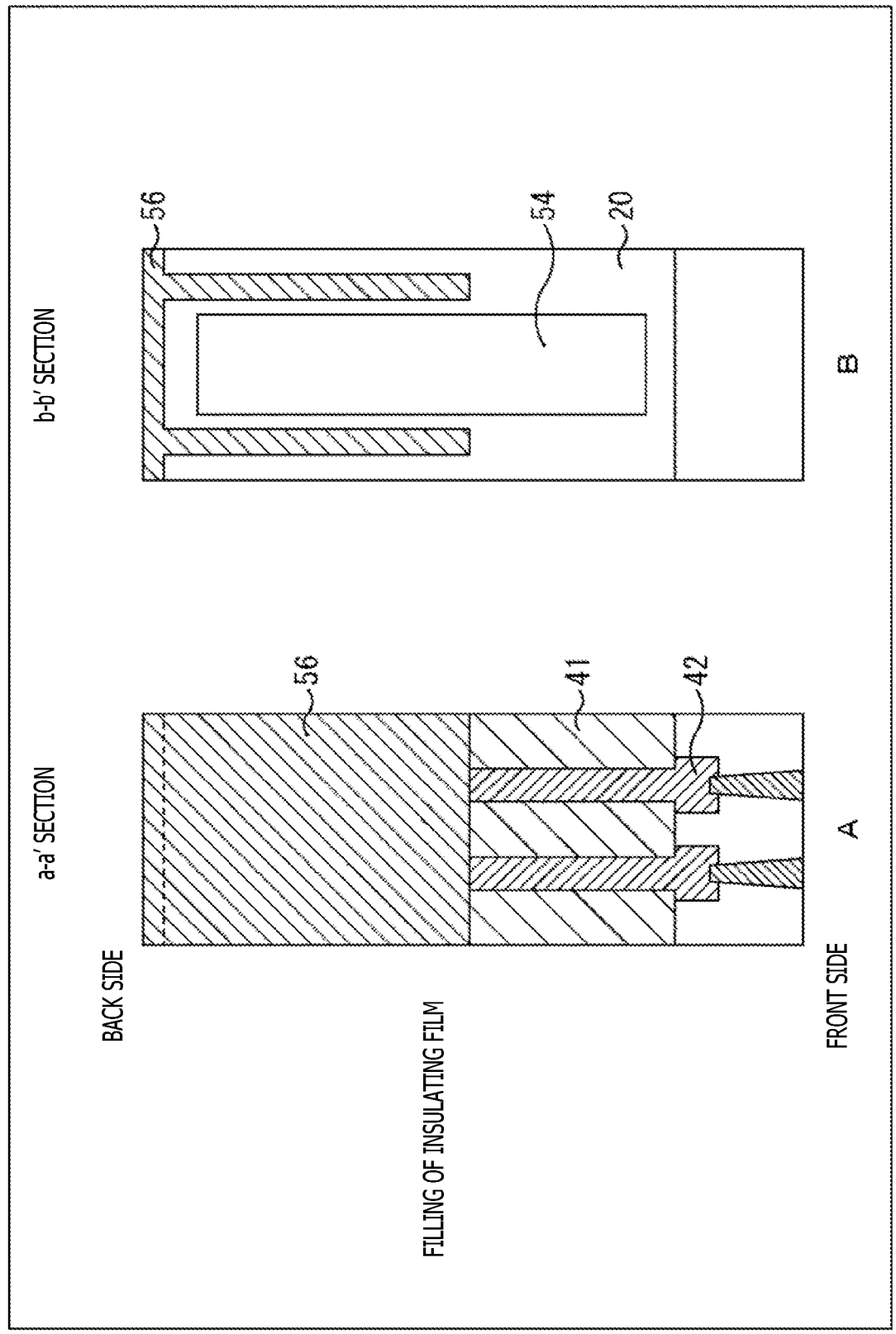
FIG. 26 depicts cross-sectional views illustrating the further formation method of the trench structures and the through-electrodes.
Figure 27:
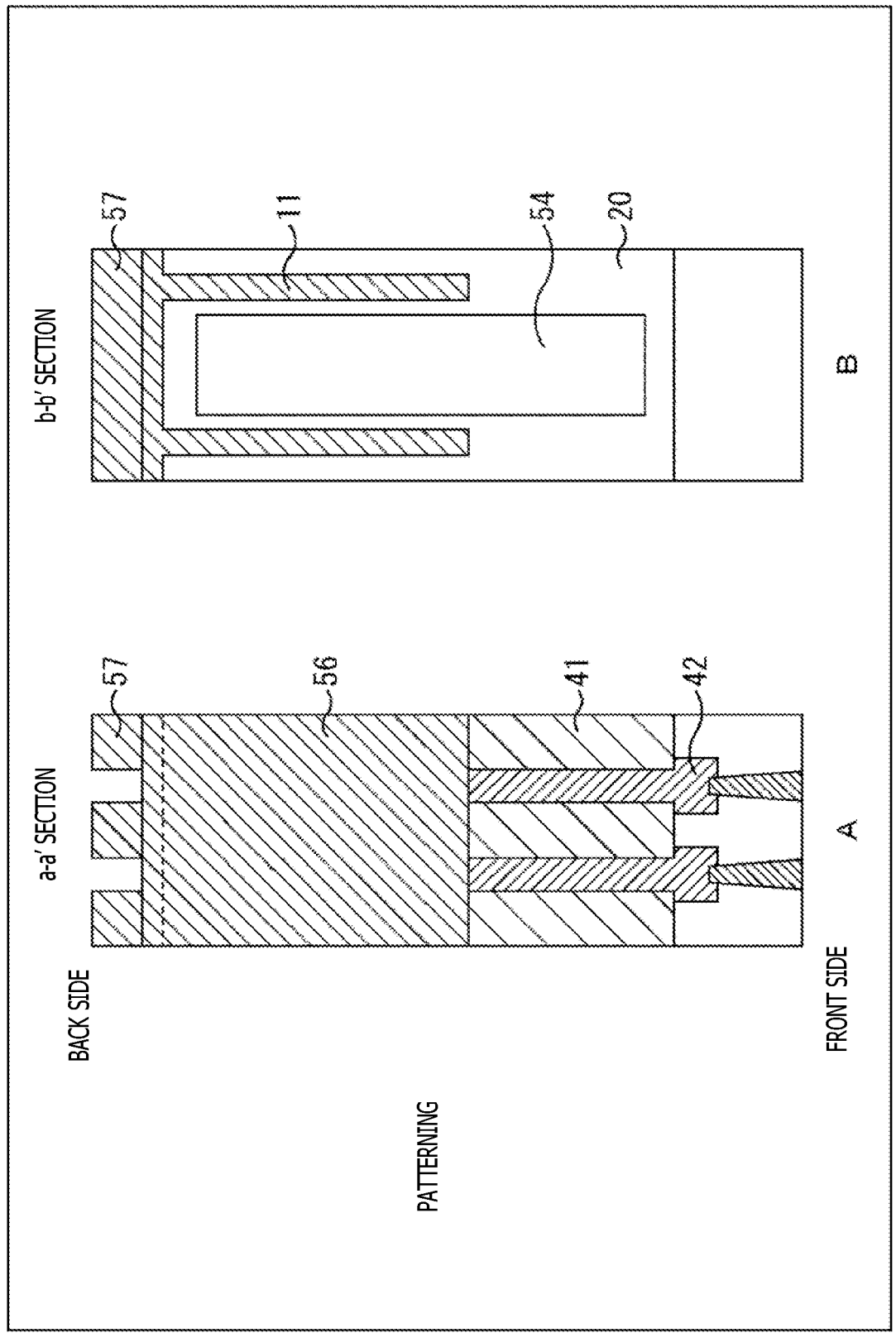
FIG. 27 depicts cross-sectional views illustrating the further formation method of the trench structures and the through-electrodes.
Figure 28:
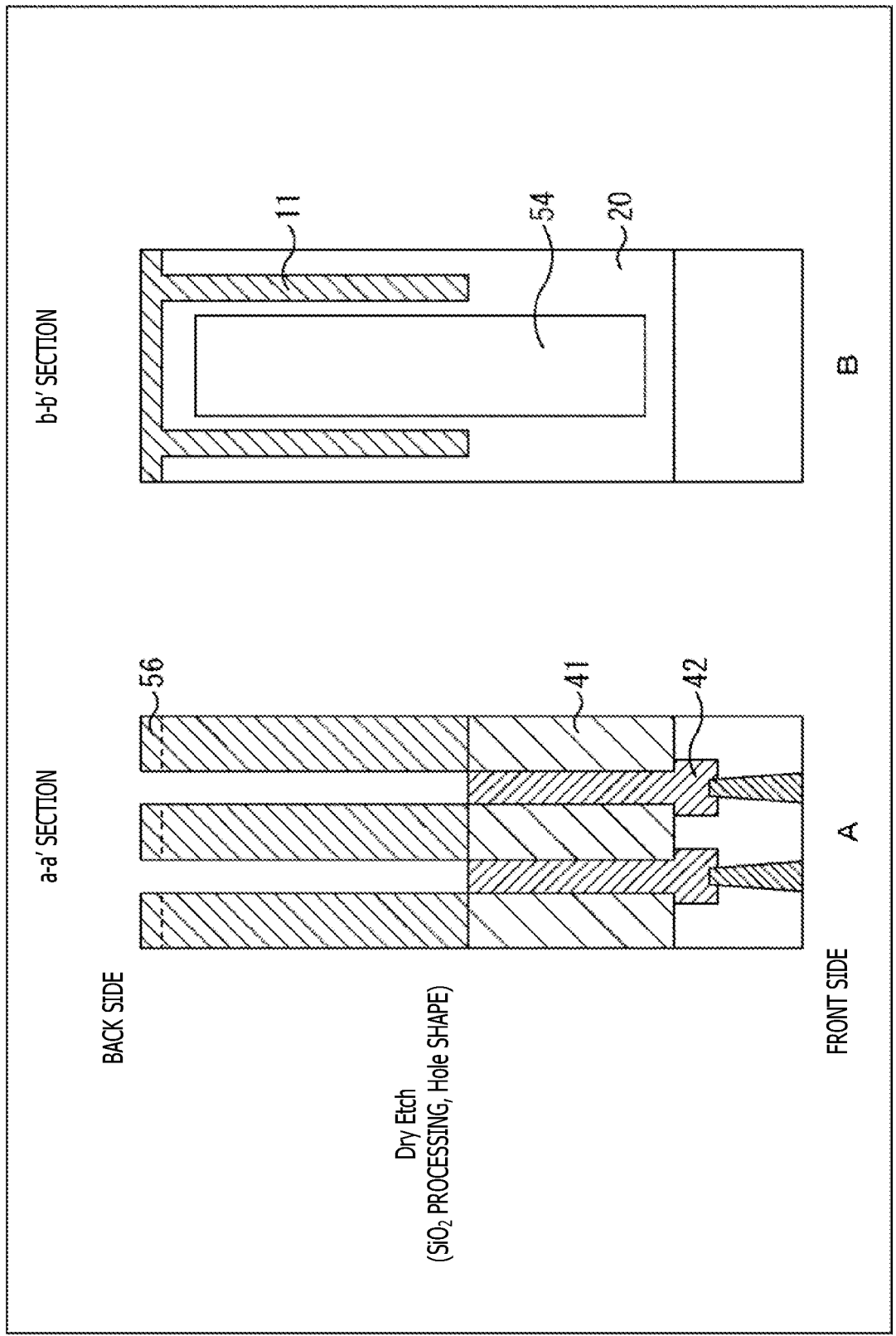
FIG. 28 depicts cross-sectional views illustrating the further formation method of the trench structures and the through-electrodes.
Figure 29:
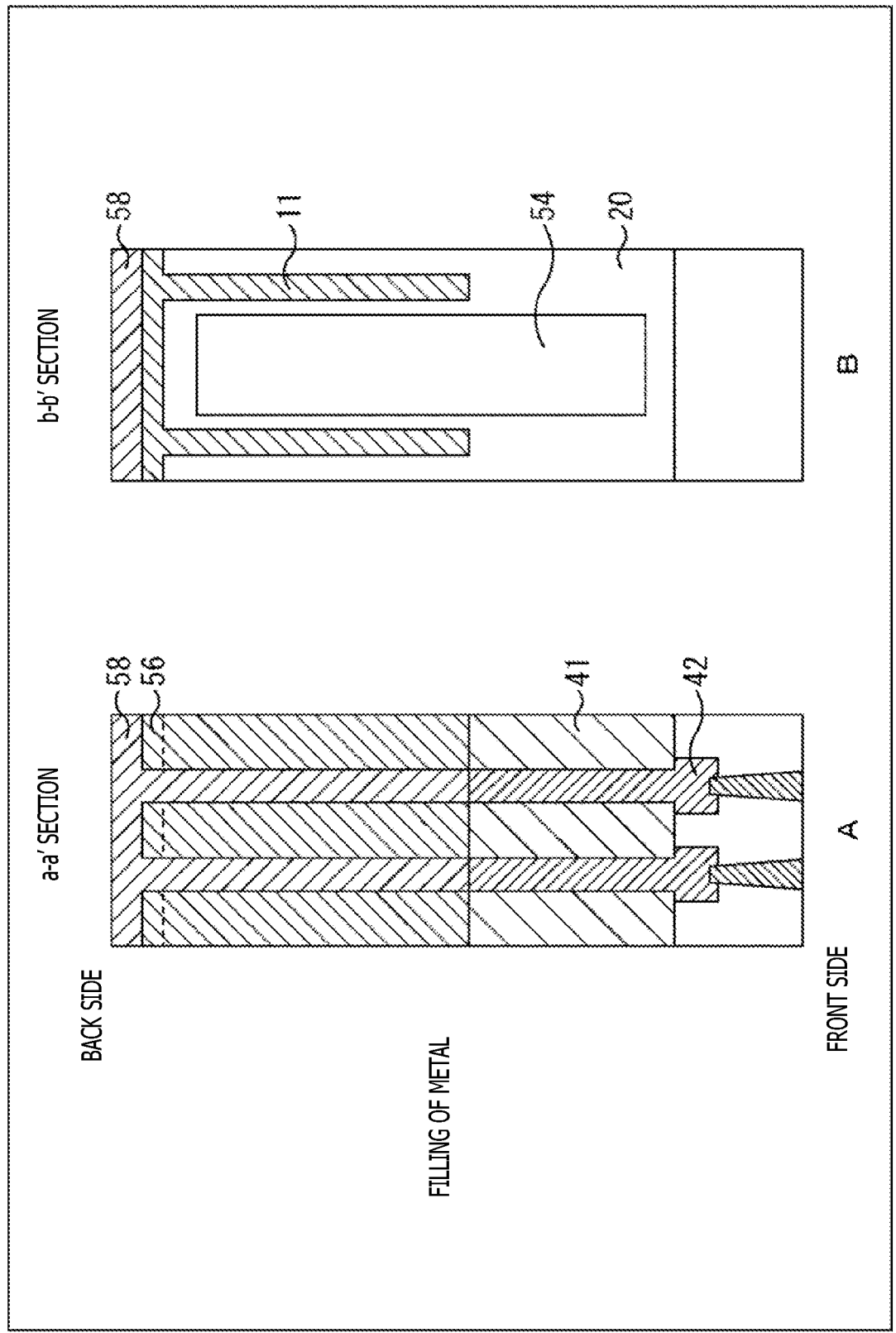
FIG. 29 depicts cross-sectional views illustrating the further formation method of the trench structures and the through-electrodes.
Figure 30:
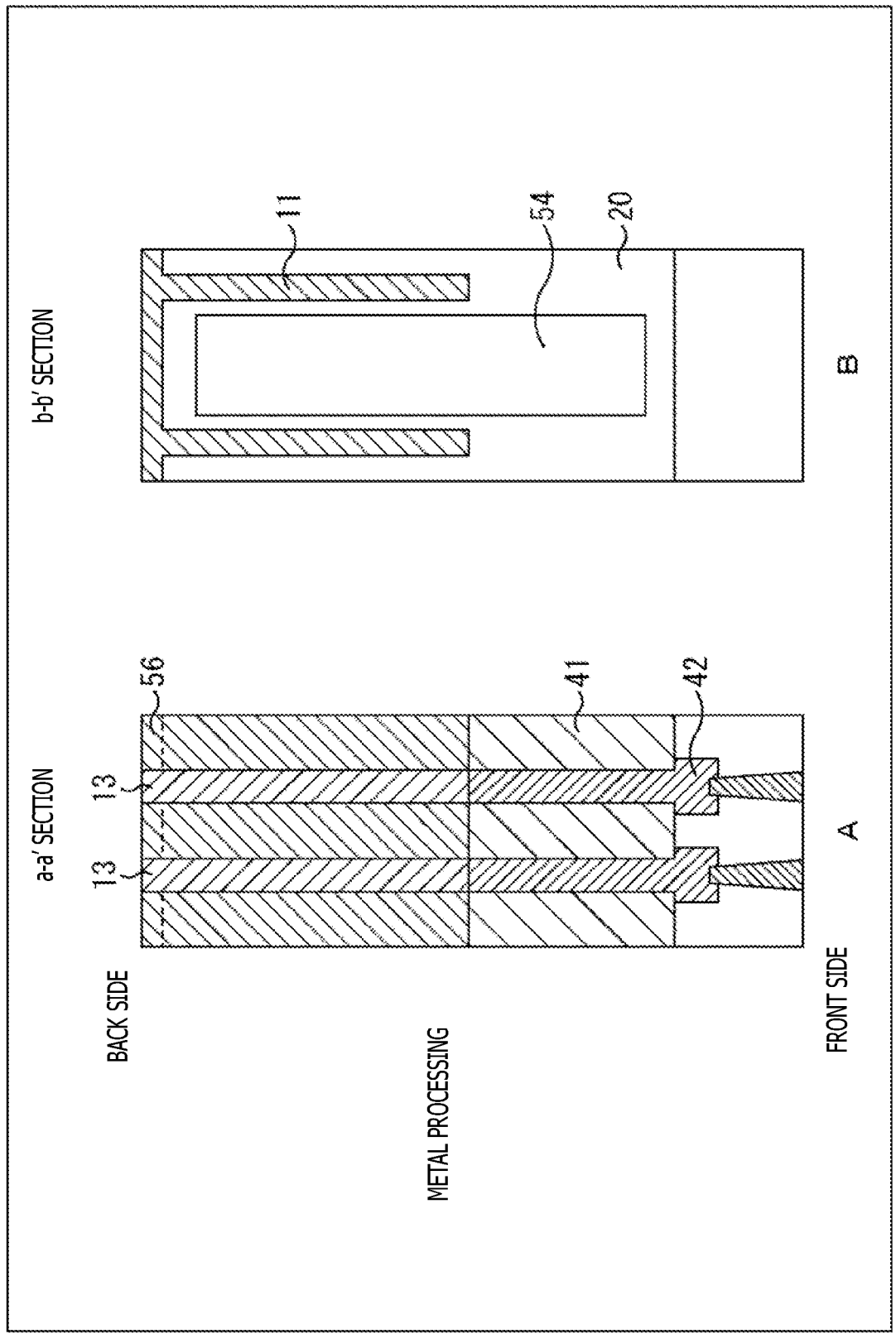
FIG. 30 depicts cross-sectional views illustrating the further formation method of the trench structures and the through-electrodes.

Then, as illustrated in FIG. 26, an insulating film 56 such as an oxide film is filled in the formed trenches by plasma CVD or the like, whereby the trench structure 11 is formed. Further, as illustrated in FIG. 27, a resist 57 is patterned by lithography so that the insulating film 56 is covered with the resist 57 except for positions where the through-electrodes 13 are to be formed. Furthermore, as illustrated in FIG. 28, the insulating film 56 (which is also the trench structure 11) is processed by dry etching or the like to form holes for the through-electrodes 13 until the holes reach the poly electrodes 42. Subsequently, as illustrated in FIG. 29, the formed holes are filled with a metal 58 such as W, TiN, or Ti by sputtering or the like. Finally, as illustrated in FIG. 30, unnecessary portions of the metal 58, the unnecessary portions being on the back surface of the Si substrate 20, are removed by CMP or the like, whereby the through-electrodes 13 are completed extending through the Si substrate 20.

According to the solid state image sensor 10 by the third formation method described above, color mixing between adjacent pixels can be inhibited owing to the inclusion of the trench structures 11. In addition, the overlapping of the trench structures 11 and the through-holes 13 eliminates the need for the provision of regions exclusively for the through-electrodes 13, so that the solid state image sensor 10 can be reduced in size and the area of the PD at each pixel can be enlarged to make improvements in Qs and light-receiving sensitivity.

Example of Extension of Trench Structures 11

Figure 31:
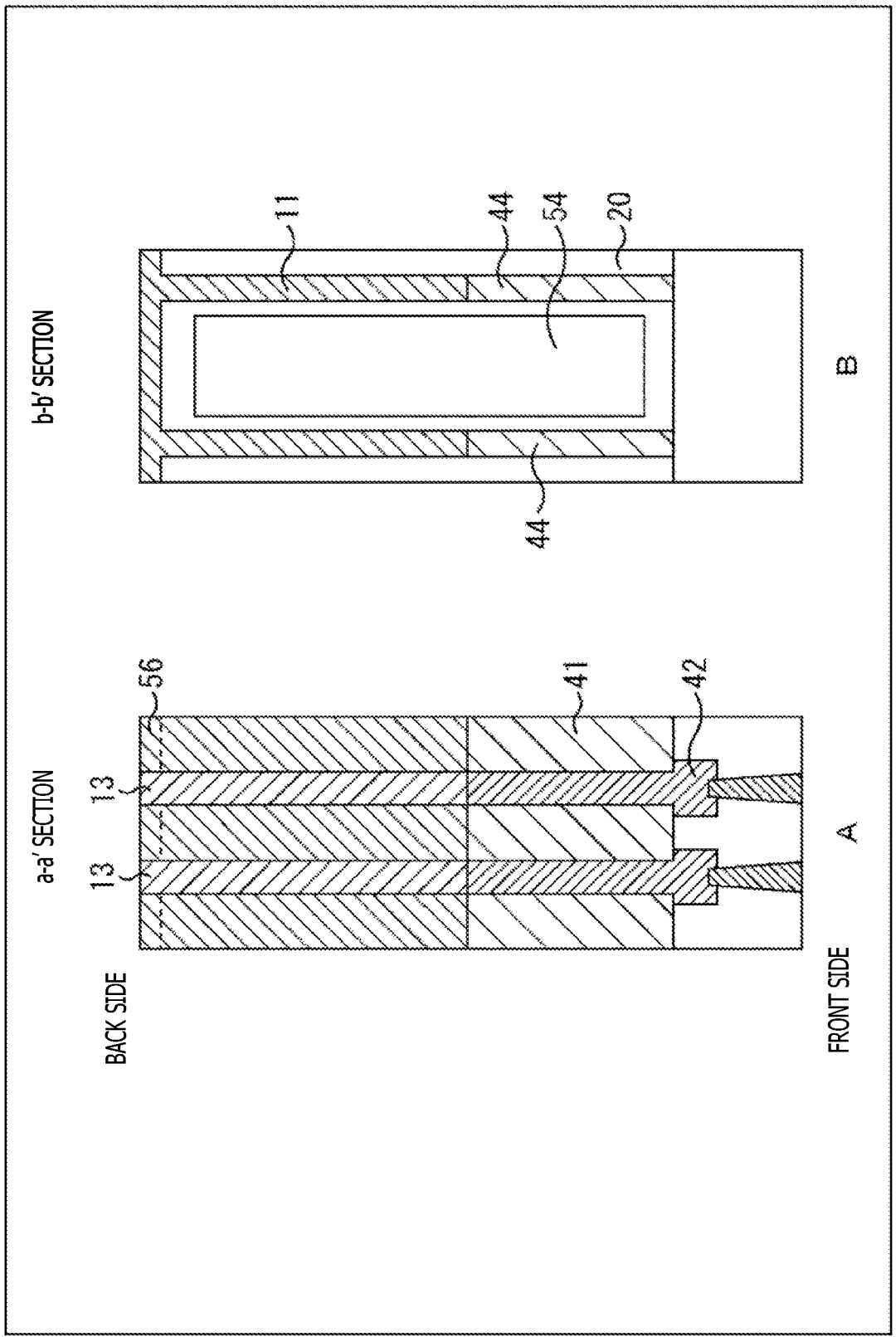
FIG. 31 depicts cross-sectional views illustrating an example of an extension of a trench structure.

FIG. 31 illustrates an example of an extension of trench structures 11.

As illustrated in B of FIG. 31, each trench structure 11 may be formed extending to a deeper portion. Described specifically, upon formation of the DTI 41 from the front side of the Si substrate 20, patterning is also conducted at a position where the trench structure 11 is to be extended, so that a trench is formed. The trench is filled with the same insulating film 44 as the DTI 41 so that the insulating film 44 can be connected to the trench structure 11 to be formed subsequently. As a consequence, it is possible to inhibit color mixing further between adjacent pixels.

Application Examples of Solid State Image Sensors

Figure 32:
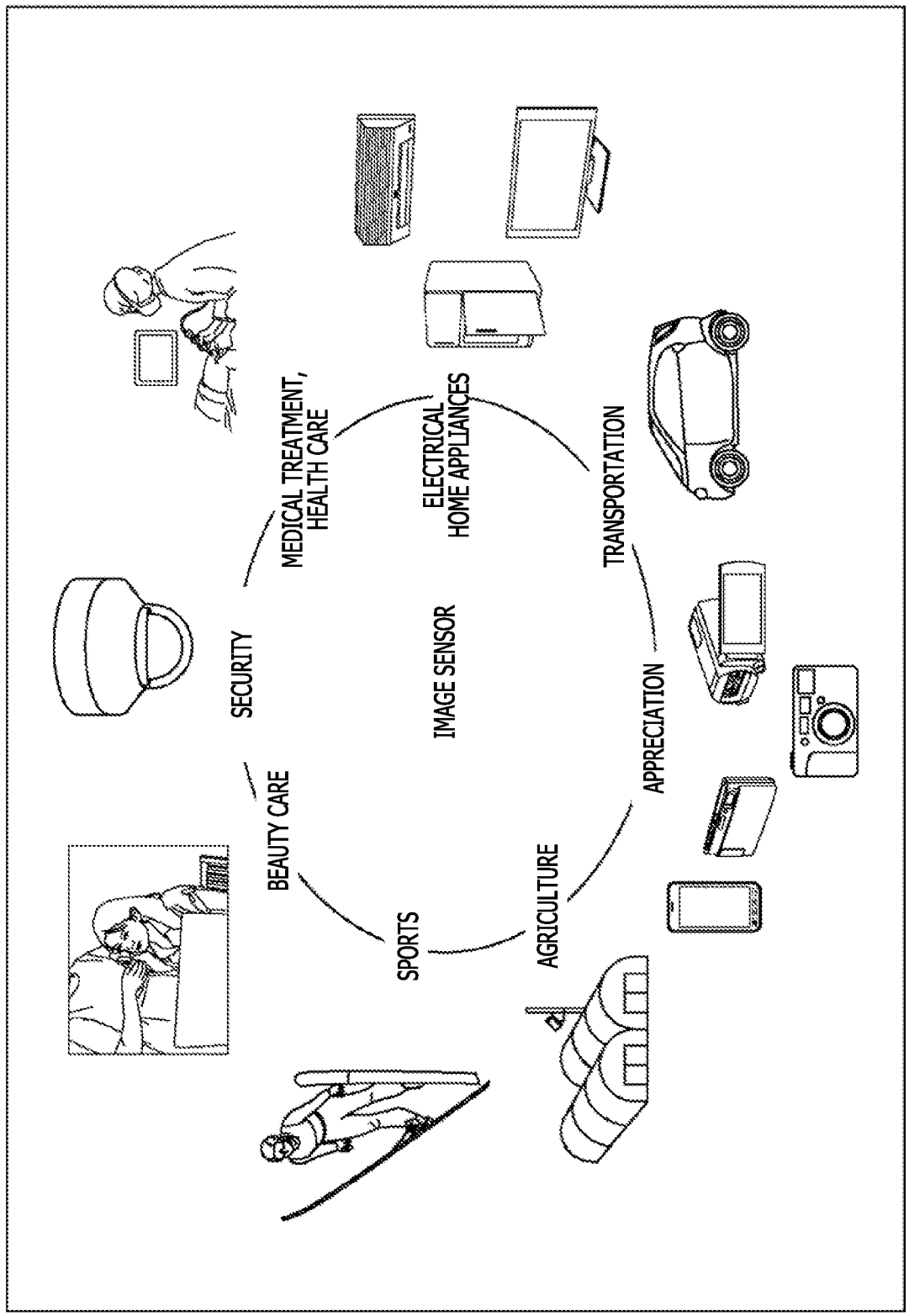
FIG. 32 is an illustrative application overview of solid state image sensors to which the present disclosure has been applied.

FIG. 32 is an overview illustrating application examples of the solid state image sensors 10 according to the embodiments of the present disclosure.

The solid state image sensors 10 can be applied, for example, to various cases that perform sensing of light such as visible light, infrared light, ultraviolet light, and X-rays, as will be described below.

Apparatuses that capture images to be provided for appreciation, such as digital cameras and mobile apparatuses equipped with a camera function.

Apparatuses provided for traffic applications, such as onboard sensors for capturing images of fronts, rears, surroundings, and interiors of automotive vehicles for safety driving such as automatic stops and recognition or the like of drivers' conditions, monitor cameras for monitoring traveling vehicles and roads, and distance measuring sensors and the like that measure distances between vehicles.

Apparatuses provided for home electric appliances such as TV sets, refrigerators, and air conditioners to perform their operations according to images of users' gestures captured beforehand.

Apparatuses provided for medical treatment and health care, such as endoscopes, and apparatuses for performing angiography based on reception of infrared light.

Apparatuses provided for security applications, such as monitor cameras for crime prevention, and cameras and the like for person identification.

Apparatuses provided for beauty applications, such as skin measuring instruments that capture images of skin, and microscopes and the like that capture images of scalp.

Apparatuses provided for sports, such as action cameras, wearable cameras and the like for applications in sports and the like.

Apparatuses for agricultural applications, such as cameras and the like for monitoring the conditions of fields and crops.

It is to be noted that embodiments of the present disclosure shall not be limited to the above-described embodiments, and various variations are possible within a scope not departing from the spirit of the present disclosure.

The present disclosure can also take such configurations as will be described below.

(1)

A solid state image sensor including:

photoelectric conversion sections formed in respective pixel sections of a semiconductor substrate;

trench structures defined by walls of insulating films formed in a depth direction of the semiconductor substrate and surrounding the respective pixel sections; and through-electrodes formed through the semiconductor substrate at positions overlapping the respective trench structures.

(2)

The solid state image sensor as described above in (1), in which the through-electrodes each connect one of the photoelectric conversion sections, which are formed on one side of the semiconductor substrate, and an FD, which is formed on an opposite side of the semiconductor substrate, with each other.

(3)

The solid state image sensor as described above in (1) or (2), in which the photoelectric conversion sections each include a photoelectric conversion film formed on the one side of the semiconductor substrate.

(4)

The solid state image sensor as described above in any one of (1) to (3), in which the through-electrodes are each formed of a conductive film filled in a hole that is formed in the insulating film defining the corresponding trench structure.

(5)

A fabrication method of a solid state image sensor, including:

forming trenches surrounding respective pixel sections of a semiconductor substrate and in a depth direction of the semiconductor substrate, and filling insulating films in the respective trenches, by which trench structures are formed; and forming holes in the insulating films in the respective trench structures and filling conductive films in the respective holes, by which through-electrodes are formed.

(6)

An electronic apparatus with a solid state image sensor mounted thereon, the solid state image sensor including:

photoelectric conversion sections formed in respective pixel sections of a semiconductor substrate;

trench structures defined by walls of insulating films formed in a depth direction of the semiconductor substrate and surrounding the respective pixel sections; and through-electrodes formed through the semiconductor substrate at positions overlapping the respective trench structures.

(7)

A solid state image sensor including:

photoelectric conversion sections formed in respective pixel sections of a semiconductor substrate;

trench structures defined by walls of insulating films formed in a depth direction of the semiconductor substrate and surrounding the respective pixel sections; and through-electrodes formed through the semiconductor substrate at positions overlapping the respective trench structures, in which the trench structures are each formed from straight portions and crosspoints where the straight portions intersect one another, and the through-electrodes are each formed at a position that overlaps one of the straight portions of the corresponding trench structure.

(8)

The solid state image sensor as described above in (7), in which the straight portions and the crosspoints of each trench structure and the associated through-electrode have the following relationship in layout dimension:

through-electrode>crosspoints of trench structure>straight portions of trench structure.

(9)

The solid state image sensor as described above in (7) or (8), in which the straight portions and the crosspoints of each trench structure and the associated through-electrode have the following relationship in depth:

through-electrode>crosspoints of trench structure>straight portions of trench structure.

(10)

A fabrication method of a solid state image sensor, the solid state image sensor including:

photoelectric conversion sections formed in respective pixel sections of a semiconductor substrate;

trench structures defined by walls of insulating films formed in a depth direction of the semiconductor substrate and surrounding the respective pixel sections; and through-electrodes formed through the semiconductor substrate at positions overlapping the respective trench structures, the trench structures being each formed from straight portions and crosspoints where the straight portions intersect one another, the through-electrodes being each formed at a position that overlaps one of the straight portions of the corresponding trench structure, in which
the straight portions and the crosspoints of each trench structure and the associated through-electrode have the following relationship in layout dimension:
through-electrode>crosspoints of trench structure>straight portions of trench structure, and
the straight portions and the crosspoints of each trench structure and the associated through-electrode have the following relationship in depth:
through-electrode>crosspoints of trench structure>straight portions of trench structure.

(11)
An electronic apparatus with a solid state image sensor mounted thereon, the solid state image sensor including:
photoelectric conversion sections formed in respective pixel sections of a semiconductor substrate;
trench structures defined by walls of insulating films formed in a depth direction of the semiconductor substrate and surrounding the respective pixel sections; and
through-electrodes formed through the semiconductor substrate at positions overlapping the respective trench structures, in which
the trench structures are each formed from straight portions and crosspoints where the straight portions intersect one another, and
the through-electrodes are each formed at a position that overlaps one of the straight portions of the corresponding trench structure.

(12)
A solid state image sensor including:
photoelectric conversion sections formed in respective pixel sections of a semiconductor substrate;
trench structures defined by walls of insulating films formed in a depth direction of the semiconductor substrate and surrounding the respective pixel sections; and
through-electrodes formed through the semiconductor substrate at positions overlapping the respective trench structures, in which
the through-electrodes are each formed of a first conductive portion, which is formed from one side of the semiconductor substrate, and a second conductive portion, which is formed from an opposite side of the semiconductor substrate, connected with each other.

(13)
The solid state image sensor as described above in (12), in which
the through-electrodes each connect one of the photoelectric conversion sections formed on the one side of the semiconductor substrate and an FD formed on an opposite side of the semiconductor substrate.

(14)
The solid state image sensor as described above in (12) or (13), in which
the photoelectric conversion sections each include a photoelectric conversion film formed on the one side of the semiconductor substrate.

(15)
A fabrication method of a solid state image sensor, the solid state image sensor including
photoelectric conversion sections formed in respective pixel sections of a semiconductor substrate,
trench structures defined by walls of insulating films formed in a depth direction of the semiconductor substrate and surrounding the respective pixel sections, and
through-electrodes formed through the semiconductor substrate at positions overlapping the respective trench structures, the fabrication method including:
forming second conductive portions from one side of the semiconductor substrate at positions where the respective through-electrodes are to be formed;
forming trenches surrounding the respective pixel sections of the semiconductor substrate, from an opposite side of the semiconductor substrate and in a depth direction of the semiconductor substrate, and filling insulating films in the respective trenches, by which trench structures are formed; and
forming holes in the insulating films of the respective trench structures from the opposite side of the semiconductor substrate, and filling conductive films in the respective holes to form second conductive portions so that the second conductive portions are connected with the corresponding ones of the first conductive portions, by which the through-electrodes are formed.

(16)
An electronic apparatus with a solid state image sensor mounted thereon, the solid state image sensor including:
photoelectric conversion sections formed in respective pixel sections of a semiconductor substrate;
trench structures defined by walls of insulating films formed in a depth direction of the semiconductor substrate and surrounding the respective pixel sections; and
through-electrodes formed through the semiconductor substrate at positions overlapping the respective trench structures, in which
the through-electrodes are each formed of a first conductive portion, which is formed from one side of the semiconductor substrate, and a second conductive portion, which is formed from an opposite side of the semiconductor substrate, connected with each other.

REFERENCE SIGNS LIST

10 Solid state image sensor, 11 Trench structure, 12 Trench structure crosspoint, 13 Through-electrode, 14 Pixel section, 20 Si substrate, 21 STI, 22 Poly electrode, 32 Insulating film, 34 Metal, 41 DTI, 42 Poly electrode, 44 Insulating film, 53 Conductive film, 54 Photoelectric conversion section, 56 Insulating film, 58 Metal

What is claimed is:
1. A solid state image sensor, comprising:
photoelectric conversion sections formed in respective pixel sections of a semiconductor substrate;
trench structures defined by walls of insulating films formed in a depth direction of the semiconductor substrate and surrounding the respective pixel sections; and
through-electrodes formed through the semiconductor substrate at positions overlapping the respective trench structures,
wherein the trench structures are each formed from straight portions and crosspoints where the straight portions intersect one another,
wherein the through-electrodes are each formed at a position that overlaps one of the straight portions of the corresponding trench structure, and
wherein the straight portions and the crosspoints of each trench structure and the associated through-electrode have the following relationship in terms of width:
through-electrode>crosspoints of trench structure>straight portions of trench structure.

2. The solid state image sensor according to claim 1, wherein the through-electrodes each connect one of the photoelectric conversion sections, which are formed on one side of the semiconductor substrate, with an FD which is formed on an opposite side of the semiconductor substrate.

3. The solid state image sensor according to claim 2, wherein the photoelectric conversion sections each include a photoelectric conversion film formed on the one side of the semiconductor substrate.

4. The solid state image sensor according to claim 1, wherein the through-electrodes are each formed of a conductive film filled in a hole that is formed in the insulating film defining the corresponding trench structure.

5. A fabrication method of a solid state image sensor, comprising:
forming trenches surrounding respective pixel sections of a semiconductor substrate and in a depth direction of the semiconductor substrate;
filling insulating films in the respective trenches, by which trench structures are formed;
forming holes in the insulating films in the respective trench structures; and
filling conductive films in the respective holes, by which through-electrodes are formed,
wherein the trench structures are each formed from straight portions and crosspoints where the straight portions intersect one another,
wherein the through-electrodes are each formed at a position that overlaps one of the straight portions of the corresponding trench structure, and
wherein the straight portions and the crosspoints of each trench structure and the associated through-electrode have the following relationship in terms of depth:
through-electrode>crosspoints of trench structure>straight portions of trench structure.

6. An electronic apparatus with a solid state image sensor mounted thereon, the solid state image sensor, comprising:
photoelectric conversion sections formed in respective pixel sections of a semiconductor substrate;
trench structures defined by walls of insulating films formed in a depth direction of the semiconductor substrate and surrounding the respective pixel sections; and
through-electrodes formed through the semiconductor substrate at positions overlapping the respective trench structures,
wherein the trench structures are each formed from straight portions and crosspoints where the straight portions intersect one another,
wherein the through-electrodes are each formed at a position that overlaps one of the straight portions of the corresponding trench structure, and
wherein the straight portions and the crosspoints of each trench structure and the associated through-electrode have the following relationship in terms of depth:
through-electrode>crosspoints of trench structure>straight portions of trench structure.

7. A solid state image sensor, comprising:
photoelectric conversion sections formed in respective pixel sections of a semiconductor substrate;
trench structures defined by walls of insulating films formed in a depth direction of the semiconductor substrate and surrounding the respective pixel sections; and
through-electrodes formed through the semiconductor substrate at positions overlapping the respective trench structures,
wherein the trench structures are each formed from straight portions and crosspoints where the straight portions intersect one another,
wherein the through-electrodes are each formed at a position that overlaps one of the straight portions of the corresponding trench structure, and
wherein the straight portions and the crosspoints of each trench structure and the associated through-electrode have the following relationship in terms of depth:
through-electrode>crosspoints of trench structure>straight portions of trench structure.

8. A fabrication method of a solid state image sensor, the solid state image sensor comprising:
photoelectric conversion sections formed in respective pixel sections of a semiconductor substrate;
trench structures defined by walls of insulating films formed in a depth direction of the semiconductor substrate and surrounding the respective pixel sections; and
through-electrodes formed through the semiconductor substrate at positions overlapping the respective trench structures,
wherein the trench structures being each formed from straight portions and crosspoints where the straight portions intersect one another,
wherein the through-electrodes being each formed at a position that overlaps one of the straight portions of the corresponding trench structure,
wherein the straight portions and the crosspoints of each trench structure and the associated through-electrode have the following relationship in terms of width:
through-electrode>crosspoints of trench structure>straight portions of trench structure, and
wherein the straight portions and the crosspoints of each trench structure and the associated through-electrode have the following relationship in terms of depth:
through-electrode>crosspoints of trench structure>straight portions of trench structure.

9. An electronic apparatus with a solid state image sensor mounted thereon, the solid state image sensor comprising:
photoelectric conversion sections formed in respective pixel sections of a semiconductor substrate;
trench structures defined by walls of insulating films formed in a depth direction of the semiconductor substrate and surrounding the respective pixel sections; and
through-electrodes formed through the semiconductor substrate at positions overlapping the respective trench structures,
wherein the trench structures are each formed from straight portions and crosspoints where the straight portions intersect one another,
wherein the through-electrodes are each formed at a position that overlaps one of the straight portions of the corresponding trench structure, and
wherein the straight portions and the crosspoints of each trench structure and the associated through-electrode have the following relationship in terms of width dimension:
through-electrode>crosspoints of trench structure>straight portions of trench structure.

10. A solid state image sensor, comprising:
photoelectric conversion sections formed in respective pixel sections of a semiconductor substrate;

trench structures defined by walls of insulating films formed in a depth direction of the semiconductor substrate and surrounding the respective pixel sections; and through-electrodes formed through the semiconductor substrate at positions overlapping the respective trench structures, wherein the through-electrodes are each formed of a first conductive portion, which is formed from one side of the semiconductor substrate, and a second conductive portion, which is formed from an opposite side of the semiconductor substrate, connected with each other and wherein each of the first and second conductive portions are at least partially provided within the walls of the insulating film of the trench structures.

11. The solid state image sensor according to claim 10, wherein the through-electrodes each connect to one of the photoelectric conversion sections formed on the one side of the semiconductor substrate and an FD formed on an opposite side of the semiconductor substrate.

12. The solid state image sensor according to claim 11, wherein the photoelectric conversion sections each include a photoelectric conversion film formed on the one side of the semiconductor substrate.

13. A fabrication method of a solid state image sensor, the solid state image sensor including:
photoelectric conversion sections formed in respective pixel sections of a semiconductor substrate,
trench structures defined by walls of insulating films formed in a depth direction of the semiconductor substrate and surrounding the respective pixel sections, and
through-electrodes formed through the semiconductor substrate at positions overlapping the respective trench structures, the fabrication method comprising:
forming second conductive portions from one side of the semiconductor substrate at positions where the respective through-electrodes are to be formed;
forming trenches surrounding the respective pixel sections of the semiconductor substrate, from an opposite side of the semiconductor substrate and in a depth direction of the semiconductor substrate, and filling insulating films in the respective trenches, by which trench structures are formed; and
forming holes in the insulating films of the respective trench structures from the opposite side of the semiconductor substrate, and filling conductive films in the respective holes to form second conductive portions so that the second conductive portions are connected with the corresponding ones of the first conductive portions, by which the through-electrodes are formed, wherein each of the first and second conductive portions are at least partially provided within the walls of the insulating film of the trench structures.

14. An electronic apparatus with a solid state image sensor mounted thereon, the solid state image sensor comprising:
photoelectric conversion sections formed in respective pixel sections of a semiconductor substrate;
trench structures defined by walls of insulating films formed in a depth direction of the semiconductor substrate and surrounding the respective pixel sections; and
through-electrodes formed through the semiconductor substrate at positions overlapping the respective trench structures,
wherein the through-electrodes are each formed of a first conductive portion, which is formed from one side of the semiconductor substrate, and a second conductive portion, which is formed from an opposite side of the semiconductor substrate, connected with each other and
wherein each of the first and second conductive portions are at least partially provided within the walls of the insulating film of the trench structures.

* * * * *